United States Patent [19]

Mizutani et al.

[11] Patent Number: 5,143,816
[45] Date of Patent: Sep. 1, 1992

[54] LIGHT-SENSITIVE COMPOSITION COMPRISING A POLYSILOXANE AND A NAPHTHOQUINONE

[75] Inventors: Kazuyoshi Mizutani; Toshiaki Aoai, both of Shizuoka, Japan

[73] Assignee: Fuji Photo Film Co., Ltd., Minami-ashigara, Japan

[21] Appl. No.: 555,599

[22] Filed: Jul. 23, 1990

[30] Foreign Application Priority Data

Jul. 28, 1989 [JP] Japan .................. 1-196108

[51] Int. Cl.$^5$ .............. G03F 7/023; G03F 7/075; C08G 77/04; C08G 77/20
[52] U.S. Cl. ........................ 430/192; 430/165; 430/193; 430/278; 528/26; 528/27; 528/28; 528/32
[58] Field of Search ............. 430/192, 193, 165, 278; 528/26, 27, 32, 40, 28

[56] References Cited

U.S. PATENT DOCUMENTS

| | | | |
|---|---|---|---|
| 4,381,396 | 4/1983 | Ryang | 549/214 |
| 4,412,038 | 10/1983 | Zerpner et al. | 525/101 |
| 4,564,579 | 1/1986 | Morita et al. | 528/26 |
| 4,603,195 | 7/1986 | Babich et al. | 528/27 |
| 4,722,881 | 2/1988 | Ueno et al. | 430/192 |
| 4,745,169 | 5/1988 | Sugiyama et al. | 430/192 |
| 4,788,127 | 11/1988 | Bailey et al. | 430/192 |
| 4,822,716 | 4/1989 | Onishi et al. | 430/192 |
| 4,837,339 | 6/1989 | Sato | 524/112 |
| 4,865,945 | 9/1989 | Noguchi et al. | 430/192 |
| 5,008,362 | 4/1991 | Wilharm et al. | 430/192 |
| 5,015,700 | 5/1991 | Herzig et al. | 525/487 |

FOREIGN PATENT DOCUMENTS 63-75741 4/1988 Japan .

*Primary Examiner*—Charles L. Bowers, Jr.
*Assistant Examiner*—John S. Chu
*Attorney, Agent, or Firm*—Burns, Doane, Swecker & Mathis

[57] ABSTRACT

A light-sensitive composition comprising:

(a) a polysiloxane compound having at least 1 mol % of a structural unit derived from a product of a thermal cycloaddition reaction between a compound of formula (I), (II), (III) or (IV) and a compound of formula (V), (VI), (VII) or (VIII), and (b) an orthoquinonediazide compound.

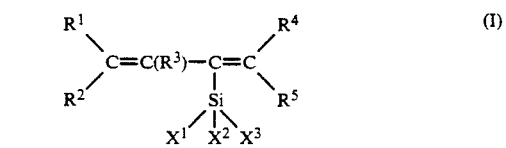
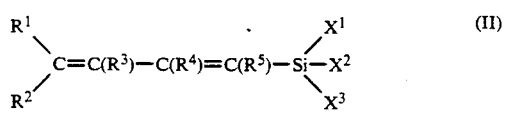
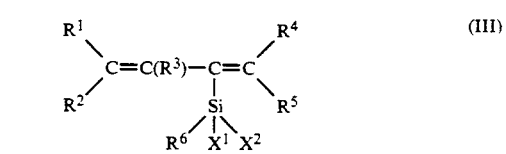
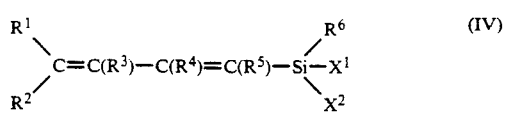
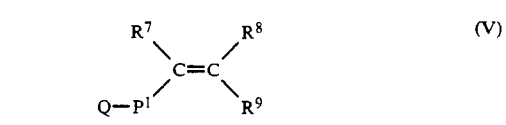
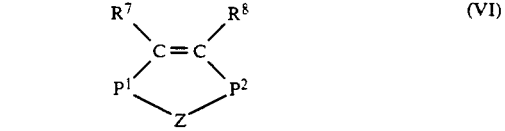
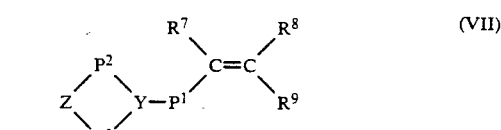
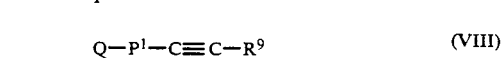

13 Claims, No Drawings

LIGHT-SENSITIVE COMPOSITION COMPRISING A POLYSILOXANE AND A NAPHTHOQUINONE

BACKGROUND OF THE INVENTION

The present invention relates to a positive working light-sensitive composition which makes it possible to form a presensitized plate for use in making a lithographic printing plate (hereunder referred to as "PS plate"), proof sheets for process printing, figures for overhead projectors or fine resist patterns required for making integrated circuits (IC) of semiconductor elements.

A light-sensitive composition comprising an o-naphthoquinonediazide compound and a novolak type phenol resin has widely been used as an excellent light-sensitive composition for making a lithographic printing plate.

However, the light-sensitive composition is poor in adhesion to a substrate for a printing plate, coating property and abrasion resistance and low in a film strength owing to the property of the novolak type phenol resin which is a main component and therefore it provides only a lithographic printing plate having insufficient printing durability.

On the other hand, as pattern-forming methods used in making electronic parts such as semiconductor elements, magnetic bubble memories and integrated circuits, there have been widely employed methods in which a photoresist sensitive to ultraviolet and visible rays is used. The photoresists are classified into two groups, one of which is negative working type ones whose exposed portions are made insoluble in a developer by irradiating with light, and the other of which is positive working ones whose exposed portions are, on the contrary, made soluble in a developer. The negative working type ones are superior in sensitivity to the positive working ones and adhesion to a substrate and resistance to chemicals required in wet etching are also excellent. Therefore, the use of negative working resists is one of the mainstreams of photolithography. However, the line width and the distance between lines of patterns become smaller as the degree of integration of semiconductor elements and the packaging density thereof are increased. In addition, dry etching techniques have been adopted as a means for etching substrates. Thus, the photoresists should have high resolution and high resistance to dry etching. For this reason, positive working photoresists are mainly utilized recently. In particular, there have been exclusively used alkali developable positive working photoresists mainly composed of alkali-soluble novolak resins as disclosed in J. C. Strieter, Kodak Microelectronics Seminar Proceedings, 1976, p. 116, since they are excellent in sensitivity, resolution and resistance to dry etching.

However, it is required to further scale down the size of patterns to thus achieve more higher packaging density and degree of integration accompanied by the recent increase in multifunctionality and high functionality of electronic devices.

More specifically, the size of integrated circuits in their transversal direction is greatly reduced, but the size thereof in the longitudinal direction cannot be reduced so much. Therefore, the ratio of the height of the resist patterns to the width thereof is correspondingly increased. For this reason, it becomes very difficult to restrict the change in size of the resist patterns on a semiconductor wafer having a complicated stepped structure as the scale down of patterns proceeds. In addition, various methods for exposure suffer from problems as the scale down in the minimum size of patterns. For instance, the exposure by means of light causes interference effect due to light reflected by the stepped portions of the substrate which greatly affects dimensional accuracy. On the other hand, in the exposure by means of an electron beam, the ratio of the height to the width of fine resist patterns cannot be increased because of the proximity effect caused due to backscattering of electrons.

It is found that most of these problems can be eliminated by the use of a multilayered resist system. The multilayered resist system is summarized in Solid State Technology, 74 (1981) and a variety of investigations on the multilayered resist system have been reported. In general, the multilayered resist methods are classified into triple layer resist method and double layer resist method. The triple layer resist method comprises applying an organic film for leveling onto the surface of a stepped substrate, and then applying thereto an inorganic intermediate layer and a resist layer in this order; patterning the resist layer, dry etching the inorganic layer using the patterned resist layer as a mask, and finally patterning the organic leveling layer by $O_2$ RIE (reactive ion etching) technique using the inorganic layer as a mask to form a desired pattern on the stepped substrate. The investigation of this method has been started from earlier stage since it can essentially utilize techniques conventionally known, but it requires the use of very complicated processes, or since these layers, i.e., an organic film, an inorganic film and an organic film which differ in physical properties from each other are superposed, the intermediate layer is liable to cause cracks or to form pinholes. Contrary to the triple layer resist method, the double layer resist method utilizes a resist having properties of both resist and inorganic intermediate layers in the triple layer resist method, more specifically a resist resistant to oxygen plasma etching and thus the formation of cracks and pinholes can be suppressed. Further, since the number of layers are reduced from 3 to 2, the process can be simplified. However, a conventional resist can be used as the upper resist in the triple layer resist method while, in the double layer resist method, it is required to newly develop a resist excellent in resistance to oxygen plasma.

Under such circumstances, there has been required to develop a highly sensitive positive working photoresist having a high degree of resolution which is excellent in resistance to oxygen plasma and can hence be used as an upper resist in the double layer resist method or the like, in particular an alkaline developable resist which can be used without changing the processes currently employed.

As such a resist, there have been proposed light-sensitive compositions comprising a combination of a conventional o-quinonediazide light-sensitive material and a silicone polymer such as polysiloxane or polysilmethylene which is made alkali-soluble, for instance, those disclosed in J.P. KOKAI Nos. Sho 61-256347, Sho 61-144639, Sho 62-159141, Sho 62-191849, Sho 62-220949, Sho 62-229136, Sho 63-90534 and Sho 63-91654 and U.S. Pat. No. 4,722,881; and a light-sensitive composition comprising a polysiloxane/carbonate block-copolymer and an effective amount of an onium salt as disclosed in J.P. KOKAI No. Sho 62-136638.

All these silicone polymers are made alkali soluble by introduction of phenolic OH group or silanol group (≡Si—OH). The introduction of phenolic groups are very difficult and silicone polymers having silanol groups are not always stable over time.

SUMMARY OF THE INVENTION

Accordingly, an object of the present invention is to provide a novel positive working light-sensitive composition which makes it possible to solve the foregoing problems, more specifically to provide a novel positive working light-sensitive composition which is useful for making a lithographic printing plate and which has high adhesion to a substrate and good coating property.

Another object of the present invention is to provide an alkali-developable positive working light-sensitive composition exhibiting excellent resistance to oxygen plasma.

A further object of the present invention is to provide a novel positive working light-sensitive composition which can easily be produced and can hence be easily available.

The inventors of this invention have conducted various studies to achieve the foregoing objects and have completed the present invention.

The present invention provides a light-sensitive composition comprising:
(a) a polysiloxane compound having at least 1 mol % of structural unit derived from a product of a thermal cycloaddition reaction between a compound of formula (I), (II), (III) or (IV) (hereinafter referred to as (A)) and a compound of formula (V), (VI), (VII) or (VIII) (hereinafter referred to as (B)) described below, and
(b) an orthoquinonediazide compound.

DETAILED EXPLANATION OF THE INVENTION

The present invention will now be explained in detail.

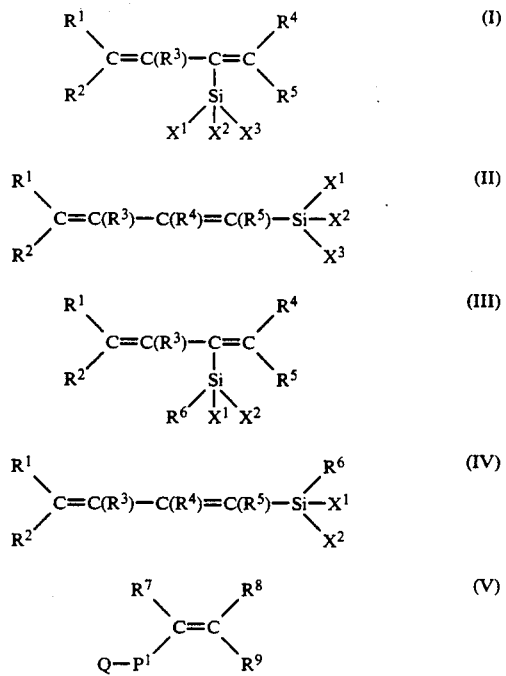

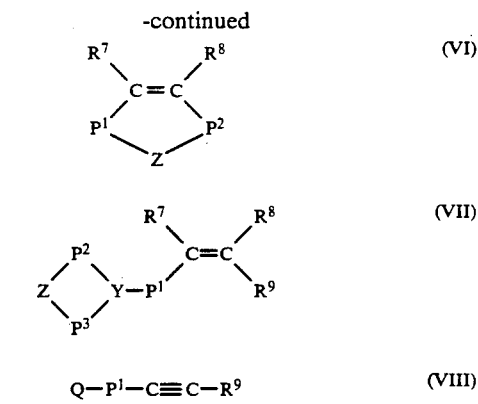

In the above formulas, $R^1$ to $R^5$ may be same or different and represent hydrogen, alkyl, substituted alkyl, aryl, substituted aryl, silyl, substituted silyl, siloxy or substituted siloxy groups. More specifically, the alkyl group is linear, branched or cyclic and preferably has about 1 to about 10 carbon atoms such as methyl, ethyl, propyl, butyl, hexyl, octyl, decyl, isopropyl, isobutyl, tert-butyl, 2-ethylhexyl or cyclohexyl. The substituted alkyl group is the above mentioned alkyl group substituted by a halogen atom such as chlorine, an alkoxy group having 1 to 6 carbon atoms such as a methoxy group, an aryl group such as a phenyl group, an aryloxy group such as a phenoxy group, a nitro or a cyano group, specifically monochloromethyl, dichloromethyl, trichloromethyl, bromomethyl, 2-chloroethyl, 2-bromoethyl, 2-methoxyethyl, 2-ethoxyethyl, phenylmethyl, naphtylmethyl, phenoxymethyl, 2-nitroethyl or 2-cyanoethyl. The aryl group is mono- or di-cyclic, more specifically phenyl, α-naphtyl or β-naphtyl group. The substituted aryl group is the above mentioned aryl group substituted by an alkyl group having 1 to 6 carbon atoms such as methyl or ethyl, an alkoxy group having 1 to 6 carbon atoms such as methoxy or ethoxy, a halogen atom such as chlorine, a nitro, phenyl, carboxy, hydroxy, amide, imide or cyano group, and more specifically 4-chlorophenyl, 2-chlorophenyl, 4-bromophenyl, 4-nitrophenyl, 4-hydroxyphenyl, 4-phenylphenyl, 4-methylphenyl, 2-methylphenyl, 4-ethylphenyl, 4-methoxyphenyl, 2-methoxyphenyl, 4-ethoxyphenyl, 2-carboxyphenyl, 4-cyanophenyl, 4-methyl-1-naphtyl, 4-chloro-1-naphtyl, 5-nitro-1-naphtyl, 5-hydroxy-1-naphtyl, 6-chloro-2-naphtyl, 4-bromo-2-naphtyl or 5-hydroxy-2-naphtyl group. The substituted silyl group is, for instance, an alkyl silyl group such as a trialkyl silyl group or an aryl silyl group such as a triaryl silyl group, the alkyl or the aryl group being same as mentioned above.

If these substituents each represents a siloxy or substituted siloxy group, these groups may be those bonded with siloxy or substituted siloxy groups of the adjacent structural units or those having a two-dimensional or three-dimensional structure such as those formed by bonding the siloxy or substituted siloxy group to that of other molecule as will be described below:

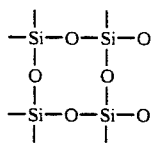

$R^6$ represents hydrogen, an alkyl, substituted alkyl, aryl, substituted aryl,

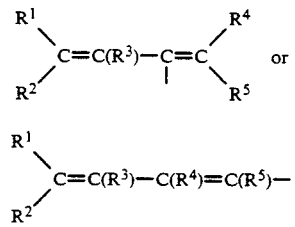

Specific examples of the alkyl, the substituted alkyl, the aryl and the substituted aryl groups are the same as those of $R^1$ to $R^5$.

$R^7$ to $R^9$ represent hydrogen, an alkyl, substituted alkyl, aryl, substituted aryl, alkoxy, substituted alkoxy, cyano, nitro, $-P^1-Q$ or

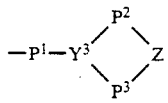

which may contain —O—, —CO—, —COO—, —OCO—, —CONR$^{10}$—, —NR$^{10}$CO—, —SO$_2$— or —SO$_3$—. Preferred examples of the alkyl and the substituted alkyl groups are those having 1 to 10 carbon atoms and preferred examples of the aryl and the substituted aryl groups are those having 6 to 14 carbon atoms, more specifically are the same as those of $R^1$ to $R^5$.

$R^{10}$ represents hydrogen, an alkyl, substituted alkyl, aryl or substituted aryl group, preferably hydrogen, an alkyl group having 1 to 10 carbon atoms, a substituted alkyl group having 1 to 10 carbon atoms, an aryl group having 6 to 14 carbon atoms or a substituted aryl group having 6 to 14 carbon atoms. Specific examples of the alkyl, the substituted alkyl, the aryl and the substituted aryl groups are the same as those of $R^1$ to $R^5$.

$R^7$ and $R^8$ or $R^7$ and $P^1$ may combine to form a ring.

$X^1$ to $X^3$ represent hydroxy groups or hydrolyzable groups which are hydrolyzed to form hydroxyl groups, preferably halogen atoms such as chlorine or bromine, alkoxy groups having 1 to 10 carbon atoms such as methoxy, ethoxy or propoxy groups, aryloxy groups having 6 to 10 carbon atoms such as phenoxy groups, acyloxy groups having 1 to 10 carbon atoms such as acetoxy groups, oxime groups having 1 to 6 carbon atoms such as methylaldoxime, amide, ureide or amino groups.

$P^1$ to $P^3$ represent single bonds, alkylene, substituted alkylene, arylene or substituted arylene groups which may contain —O—, —CO—, —COO—, —OCO—, —CONR$^{10}$—, —NR$^{10}$CO—, —SO$_2$—, or —SO$_3$—.

Specific examples of the alkylene groups include linear, branched or cyclic ones, preferably linear ones having 1 to 10 carbon atoms such as methylene, ethylene, butylene or octylene groups. The substituted alkylene groups are the above mentioned alkylene groups substituted by, for example, a halogen atom such as chlorine, an alkoxy group having 1 to 6 carbon atoms or an aryloxy group having 6 to 10 carbon atoms. The arylene groups are preferably mono- or di-cyclic ones such as phenylene or naphthylene groups. The substituted arylene groups are the above mentioned arylene groups substituted by an alkyl group having 1 to 6 carbon atoms such as methyl or ethyl group, an alkoxy group having 1 to 6 carbon atoms such as methoxy or ethoxy group or a halogen atom such as chlorine. Specific examples include chlorophenylene, bromophenylene, nitrophenylene, phenylphenylene, methylphenylene,. ethylphenylene, methoxyphenylene, ethoxyphenylene, cyanophenylene, methylnaphtylene, chloronaphtylene, bromonaphtylene or nitronaphtylene group.

$Y^3$ represents a trivalent aromatic ring preferably having 6 to 14 carbon atoms.

Q represents an acid group having pKa of not more than 12, specifically a carboxyl, sulfonic, phenolic hydroxyl, imide, N-hydroxyimide, N-sulfonylamide, sulfonamide, N-sulfonylurethane, N-sulfonylureide or a group having an active methylene group, more specifically

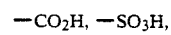

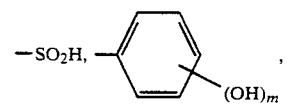

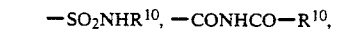

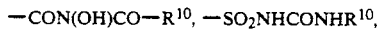

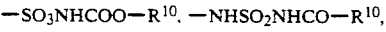

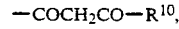

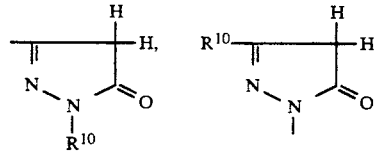

wherein m is an integer of 1 to 5.

Z represents

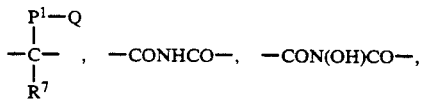

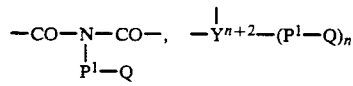

wherein $Y^{n+2}$ represents a (n+2) valent aromatic ring, preferably having 6 to 14 carbon atoms and n is an integer of 1 to 3. Specific examples of Z follow.

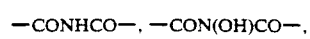

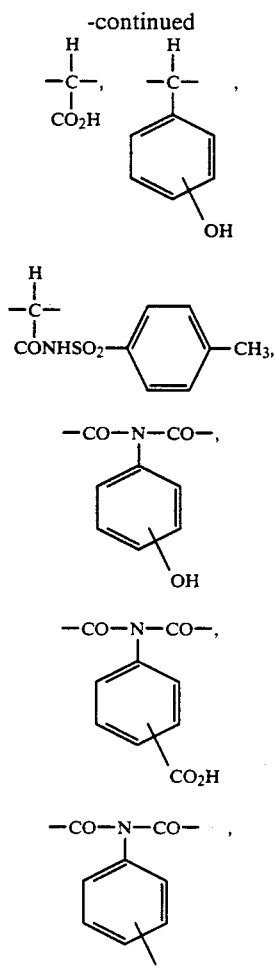

The components of the light-sensitive composition of the present invention will now be explained in detail.

POLYSILOXANE COMPOUNDS

The polysiloxane compound of the present invention is a polysiloxane containing at least 1 mol %, preferably at least 3 mol %, more preferably at least 5 mol % of siloxane unit derived from thermal cycloaddition reaction, i.e. Diels-Alder reaction product represented by formulas (IX) to (XXIV) between polysiloxane compounds (A) and (B).

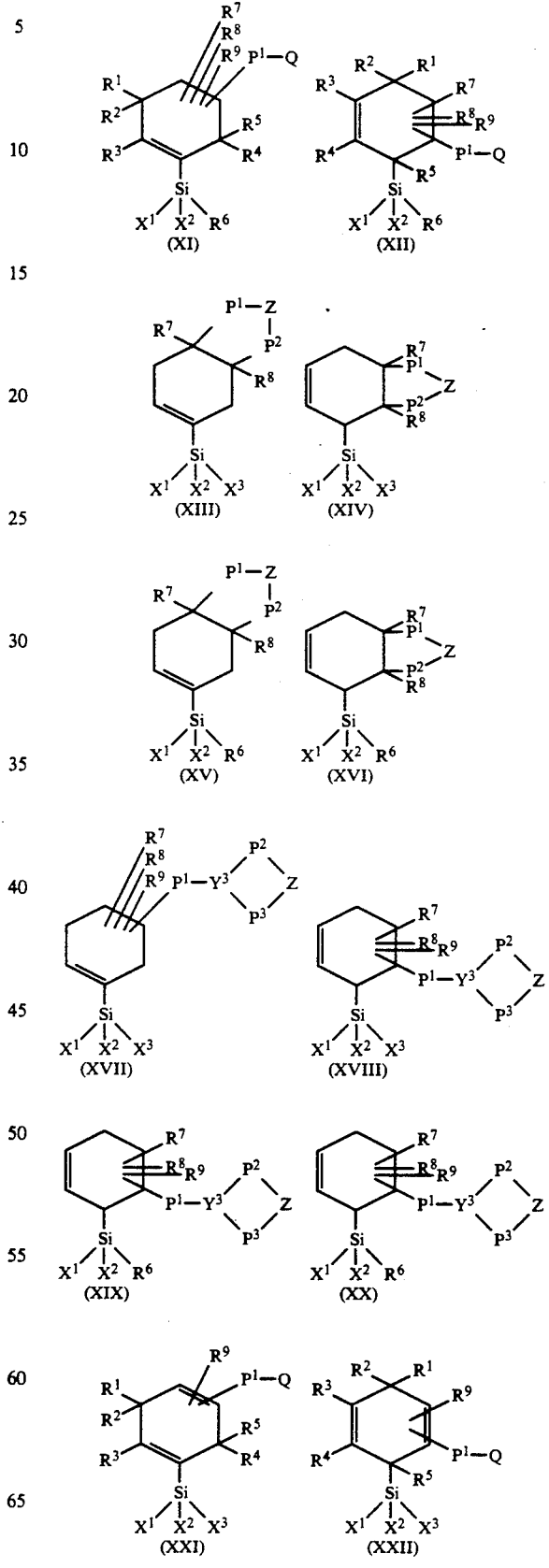

-continued

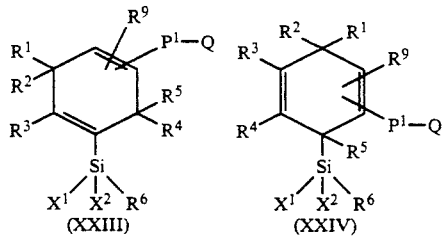

wherein $R^1$ to $R^9$, $P^1$ to $P^3$, Q, $X^1$ to $X^3$, $Y^3$ and Z are same as defined above.

The polysiloxane compounds pf the present invention may be prepared by a process which comprises the steps of:

(i) hydrolyzing or alkoxylating at least one compound (A);

(ii) subjecting the hydrolyzed or alkoxylated product of step (i) to a condensation reaction; and (iii) subjecting the condensate of step (ii) to a thermal cycloaddition reaction with at least one compound (B), whereby a polysiloxane compound is produced; or a process which comprises the steps of:

(i) subjecting at least one compound (A) and at least one compound (B) to a thermal cycloaddition reaction to prepare a compound of formula (IX) to (XXIV);

(ii) hydrolyzing or alkoxylating the reaction product of step (i); and (iii) subjecting the hydrolyzed or alkoxylated product of step (ii) to a condensation reaction, whereby a polysiloxane compound is produced:

Both the processes are simple and do not require a metal catalyst.

At least one compound of formula (XXV) to (XXIX) may coexist with the compound of formula (IX) to (XXIV) in the reaction system to improve properties of the polysiloxane compound of the present invention. In this case, the polysiloxane obtained by the co-condensation must contain at least 1 mol %, preferably, in view of alkali-solubility of the polysiloxane, at least 3 mol %, more preferably at least 5 mol % of the siloxane unit derived from the thermal cycloaddition reaction product between compounds (A) and (B).

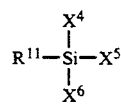

(XXV)

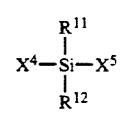

(XXVI)

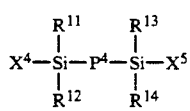

(XXVII)

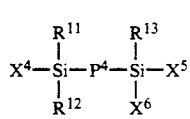

(XXVIII)

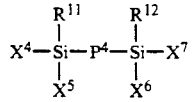

(XXIX)

In the formulas, $R^{11}$ to $R^{14}$ represent hydrogen, alkyl, substituted alkyl, aryl or substituted aryl groups, specific examples of which are the same as described for $R^6$.

$X^4$ to $X^7$ represent hydroxyl or hydrolyzable groups, specific examples of which are the same as described for $X^1$ to $X^3$.

$P^4$ represents a single bond, an alkylene, substituted alkylene, arylene or substituted arylene group. Thses groups may contain —O—, —CO—, —COO—, —OCO—, —CONR$^{10}$—, —NR$^{10}$CO—, —SO$_2$— or —SO$_3$—, specific examples of which are the same as described for $P^1$ to $P^3$.

It is also possible to coexist at least one compound of formula (XXX) or (XXXI) during the thermal cycloaddition reaction of compounds (A) and (B).

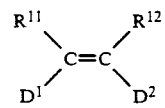

(XXX)

(XXXI)

$D^1$ and $D^2$ may be same or different and may combine to form a ring. Both of them do not contain an acid group having pKa of not more than 12, and preferably represent hydrogen, alkyl, substituted alkyl, aryl, substituted aryl, alkoxy, substituted alkoxy, silyl, substituted silyl, siloxy, substituted siloxy, cyano or nitro groups, more preferably hydrogen, alkyl groups having 1 to 10 carbon atoms, substituted alkyl groups having 1 to 10 carbon atoms, aryl groups having 6 to 14 carbon atoms or substituted aryl groups having 6 to 14 carbon atoms. These groups may contain —O—, —CO—, —COO—, —OCO—, —CONR$^{10}$—, —NR$^{10}$CO—, —SO$_2$— or —SO$_3$—. In this case, the polysiloxane compound obtained must contain at least 1 mol %, preferably at least 3 mol %, more preferably at least 5 mol % of the siloxane unit derived from the thermal cycloaddition reaction product between compounds (A) and (B).

The thermal cycloaddition reaction is carried out at a temperature ranging preferably from 50° C. to 200° C., more preferably from 70° C. to 140° C.

The weight average molecular weight of the polysiloxane of the present invention is preferably at least 500, more preferably 1,000 to 500,000.

In the synthesis of the polysiloxane compound of the present invention, a solvent may be used. Examples of the solvent include cyclohexanone, methyl ethyl ketone, acetone, methanol, ethanol, ethyleneglycolmonomethylether, ethyleneglycolmonoethylether, 2-methoxyethylacetate, 1-methoxy-2-propanol, 1-methoxy-2-propylacetate, N,N-dimethylformamide, N,N-dimethylacetamide, dimethylsulfoxide, toluene, ethylacetate, methyl lactate, ethyl lactate, γ-butyrolactone, dioxane and tetrahydrofuran, which may be used alone or in combination.

The polysiloxane compound of the present inventin may be used alone or in combination in the light-sensitive composition. The amount of the polysiloxane compound contained in the light-sensitive composition ranges about 5 to 95% by weight, preferably about 20 to 80% by weight.
Specific examples of the polysiloxane compound of the present invention are shown below.
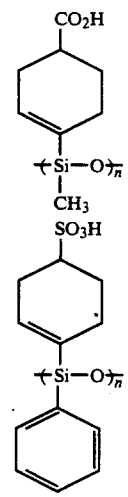
(1)
(2)
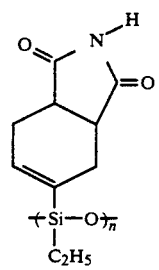
(3)
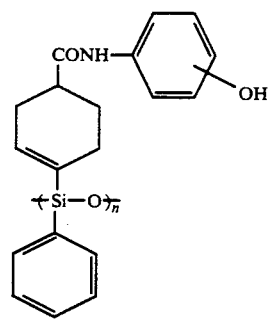
(4)
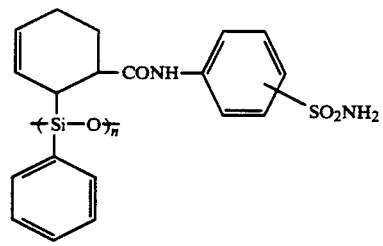
(5)
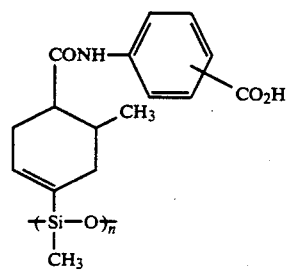
(6)

-continued
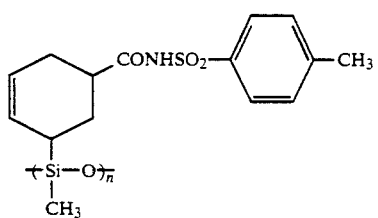
(7)
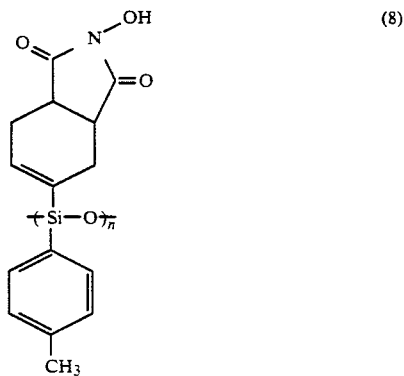
(8)
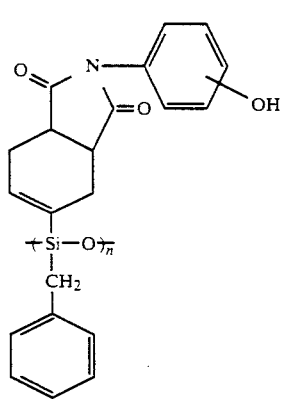
(9)
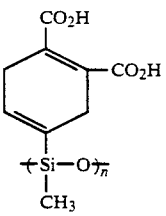
(10)
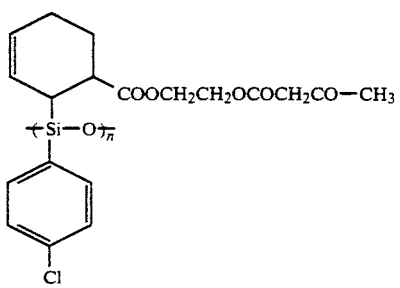
(11)

-continued
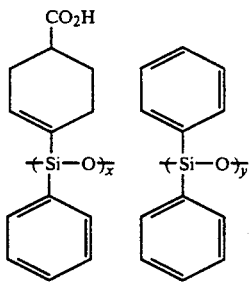
(12)
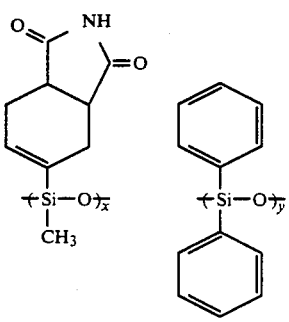
(13)
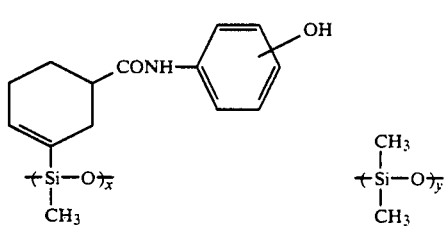
(14)
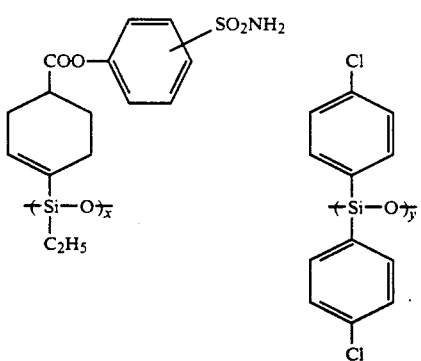
(15)
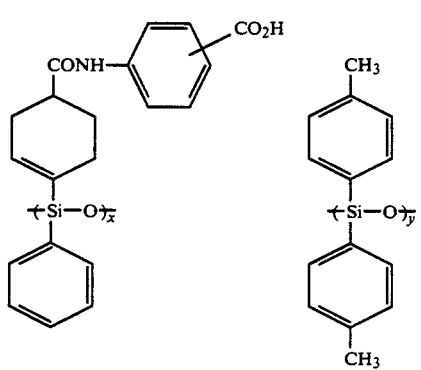
(16)

-continued
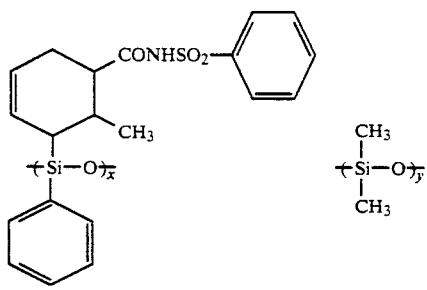 (17)
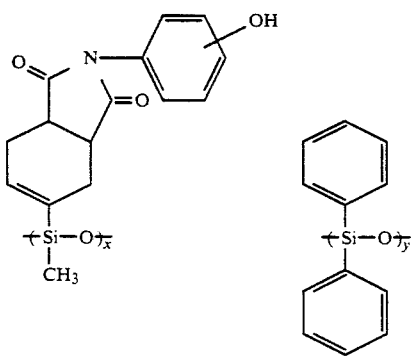 (18)
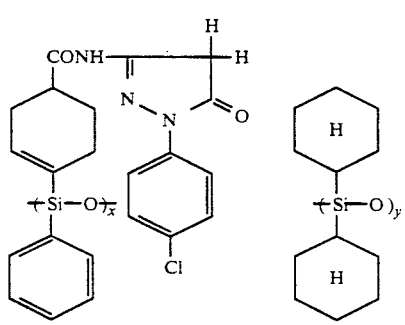 (19)
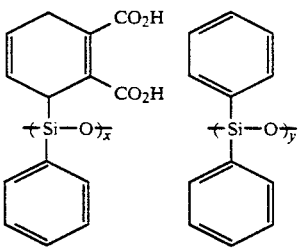 (20)
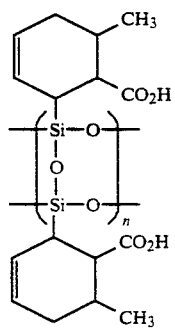 (21)

-continued
(22)
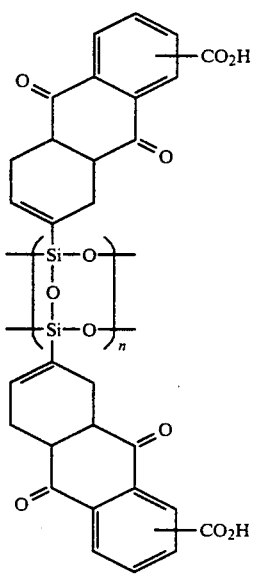
(23)
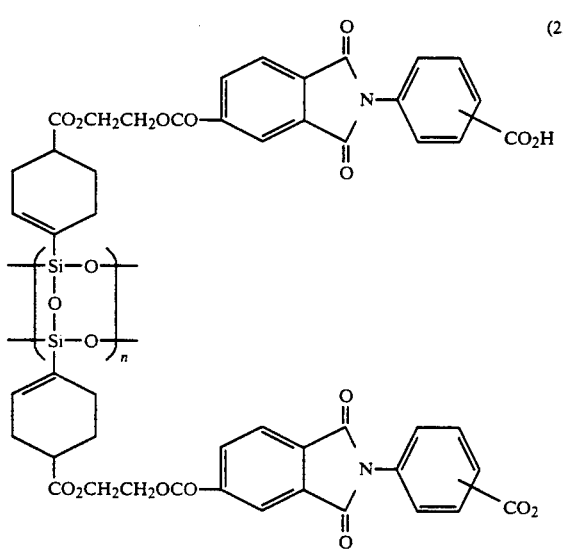
(24)
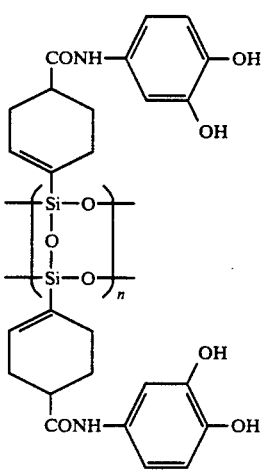

-continued
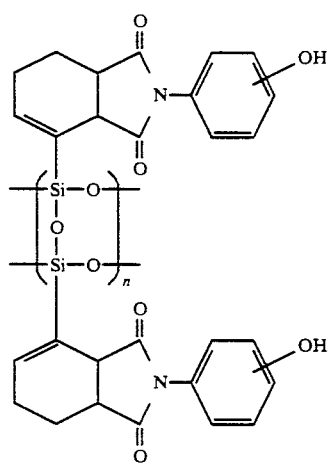
(25)
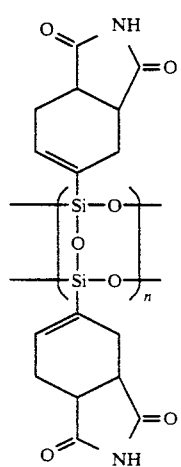
(26)
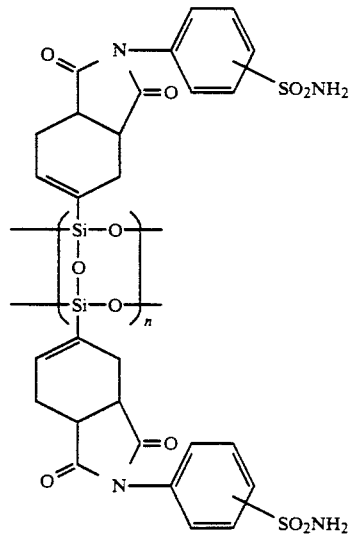
(27)

-continued
(28)
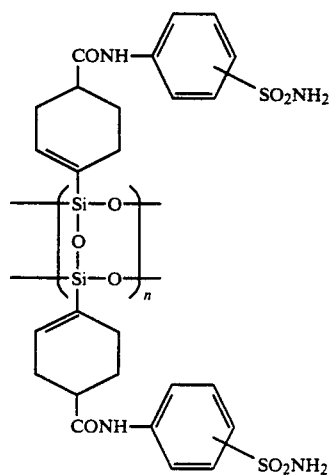
(29)
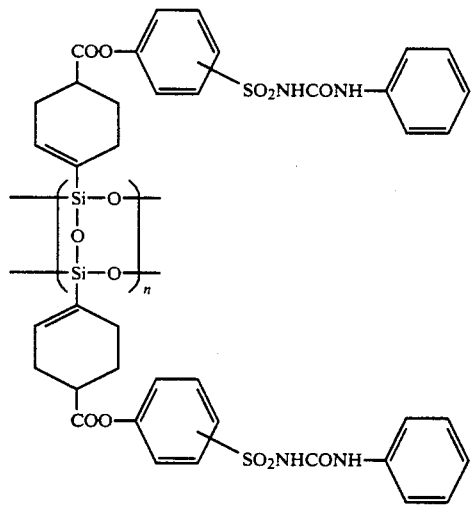
(30)
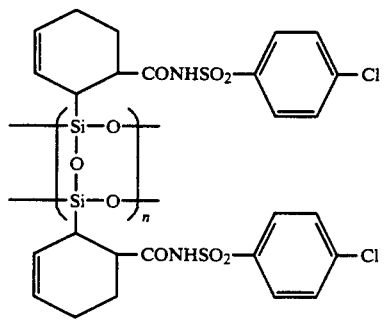

-continued
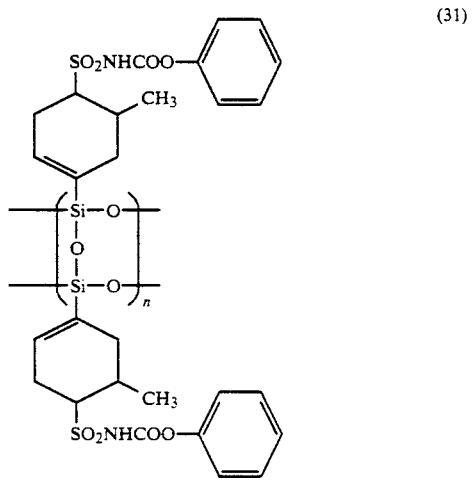
(31)
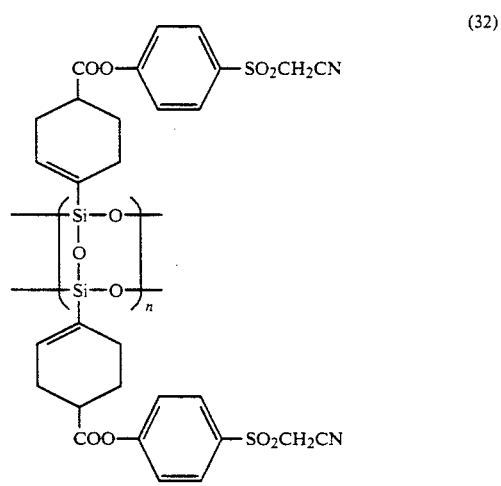
(32)
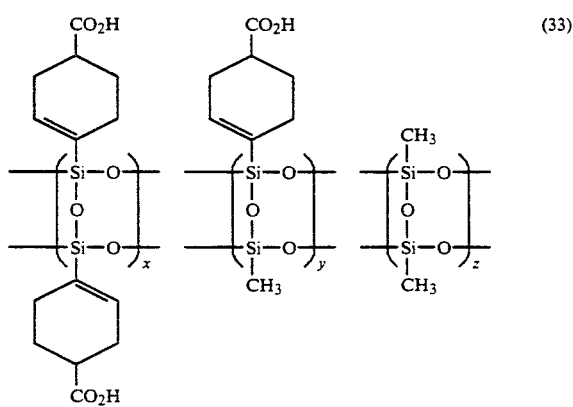
(33)

-continued
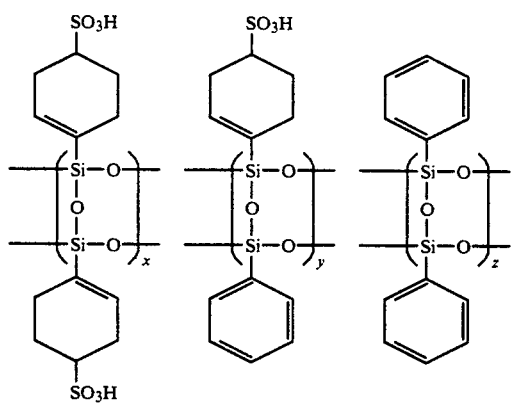
(34)
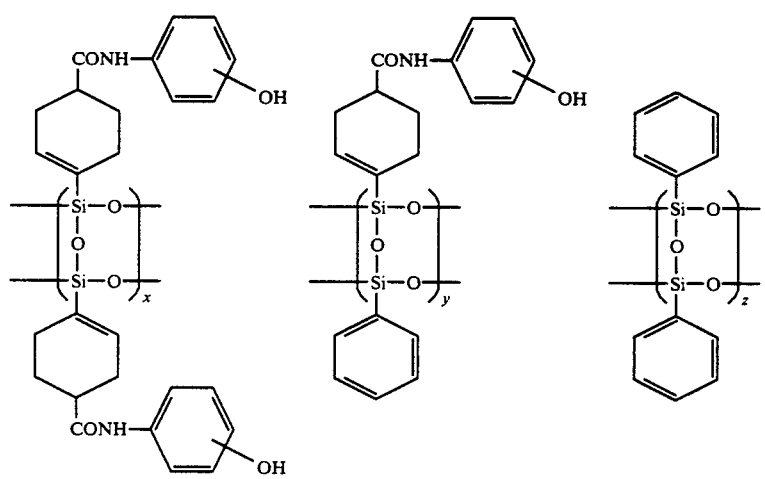
(35)
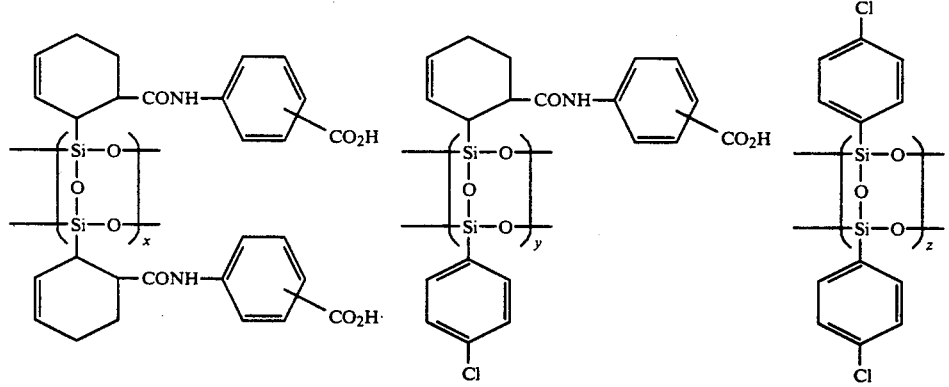
(36)
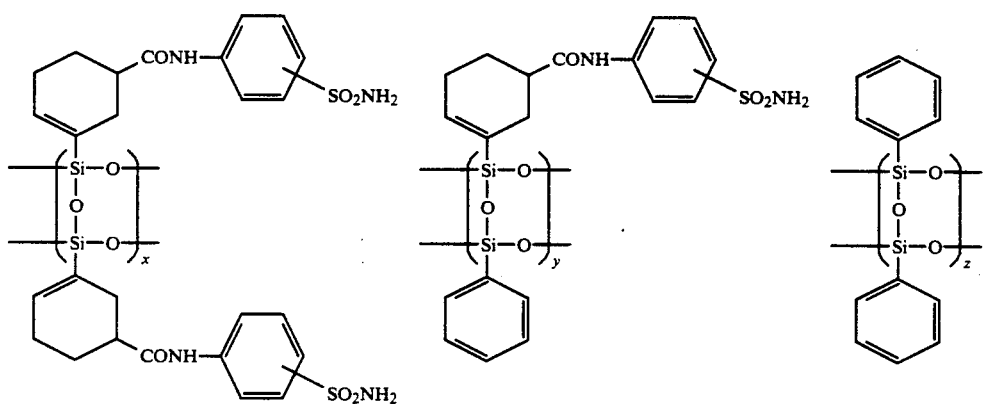
(37)

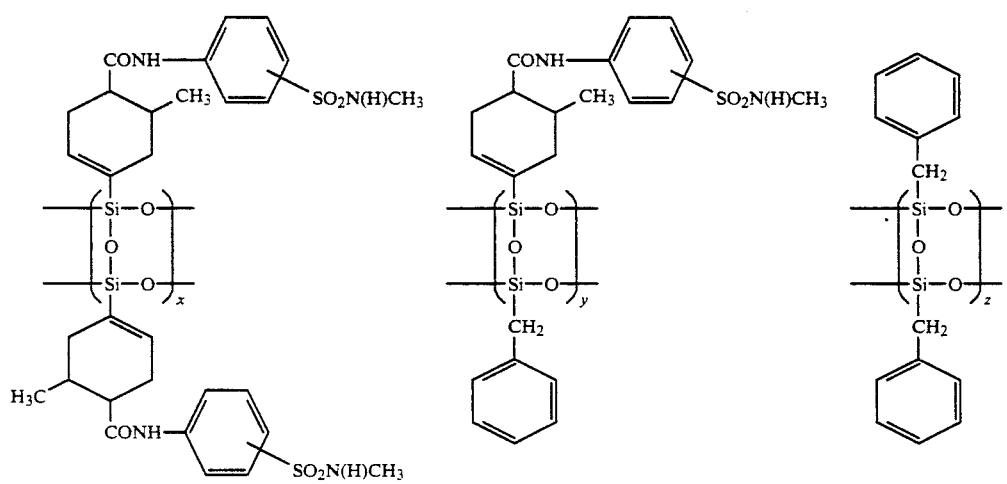
(38)
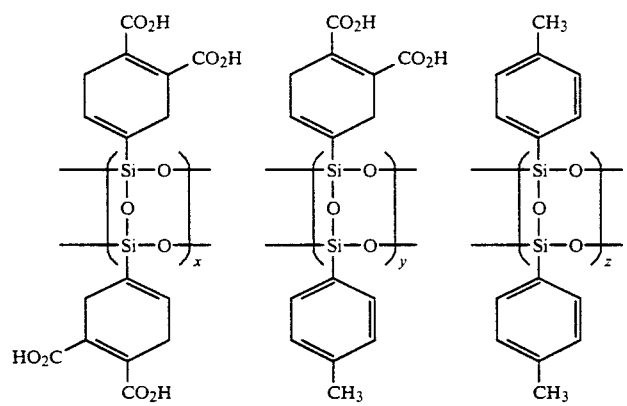
(39)
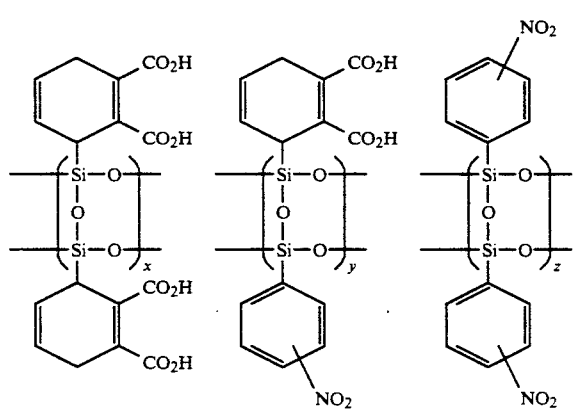
(40)

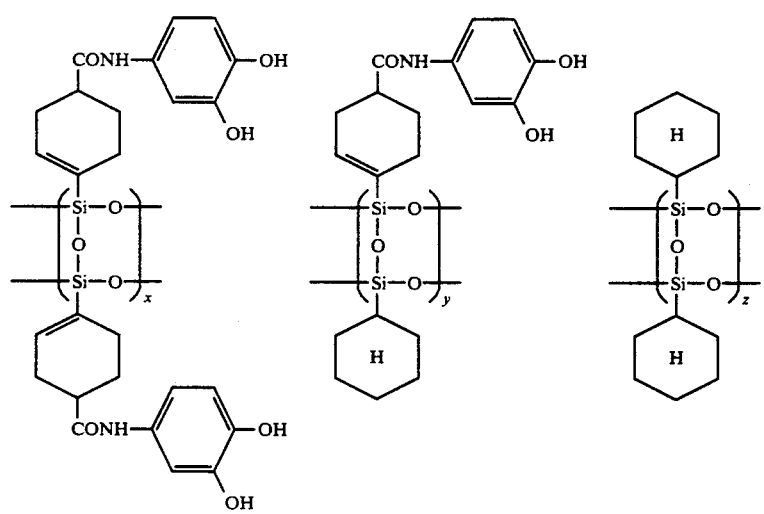
(41)
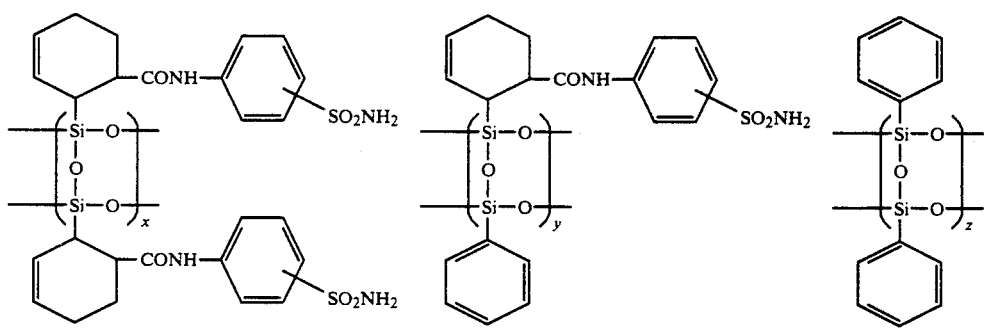
(42)
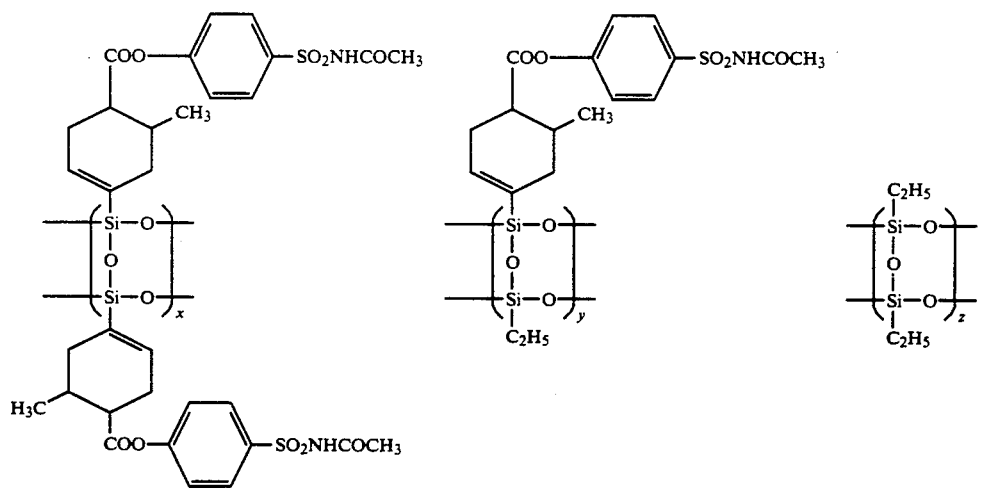
(43)
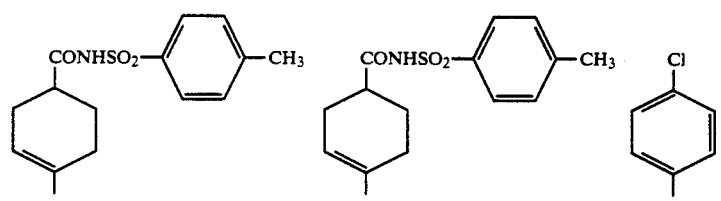
(44)

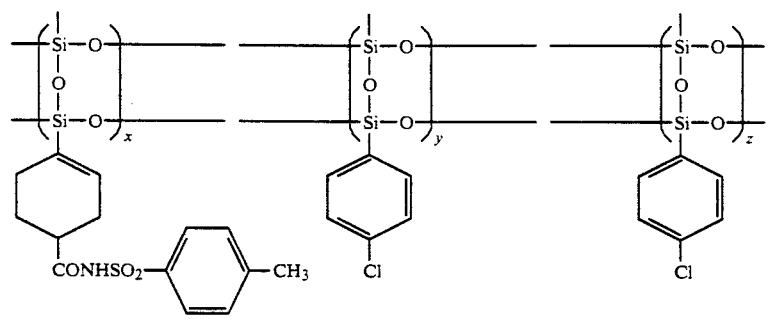
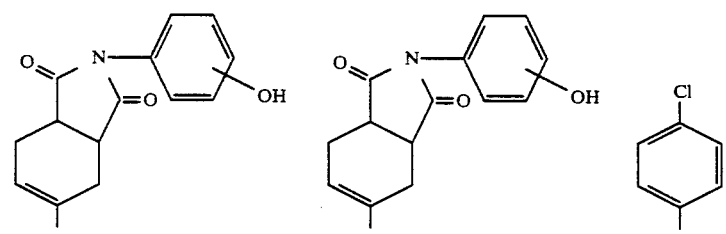
(45)
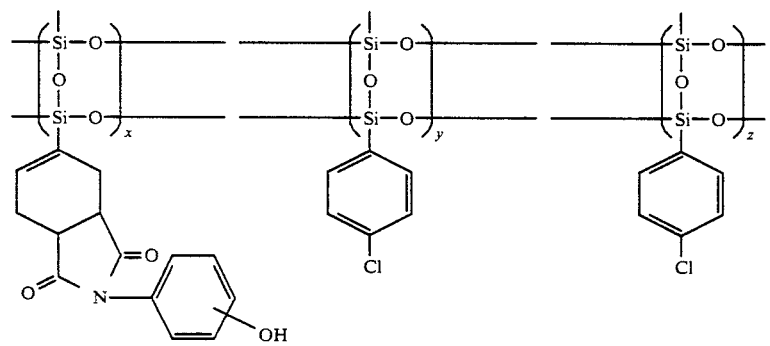
(46)
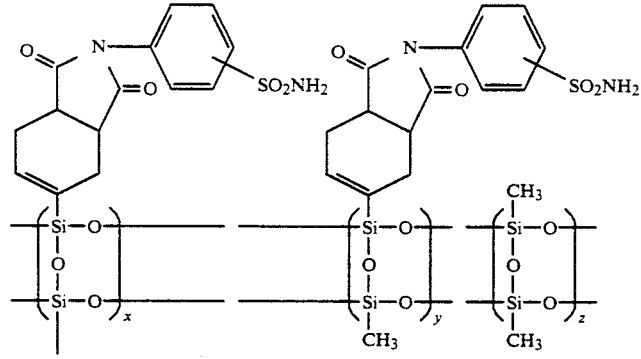
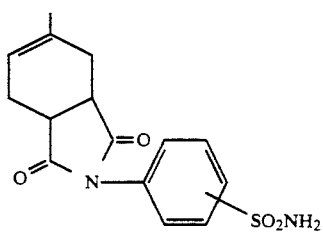

(47)
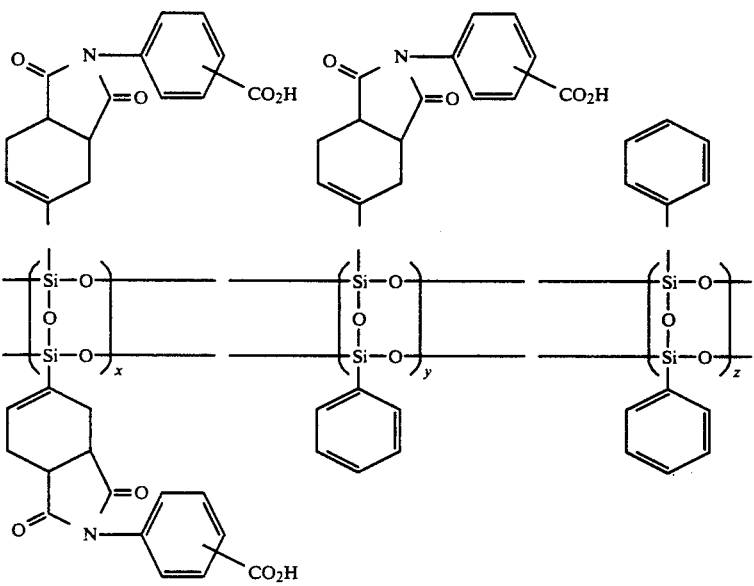
(48)
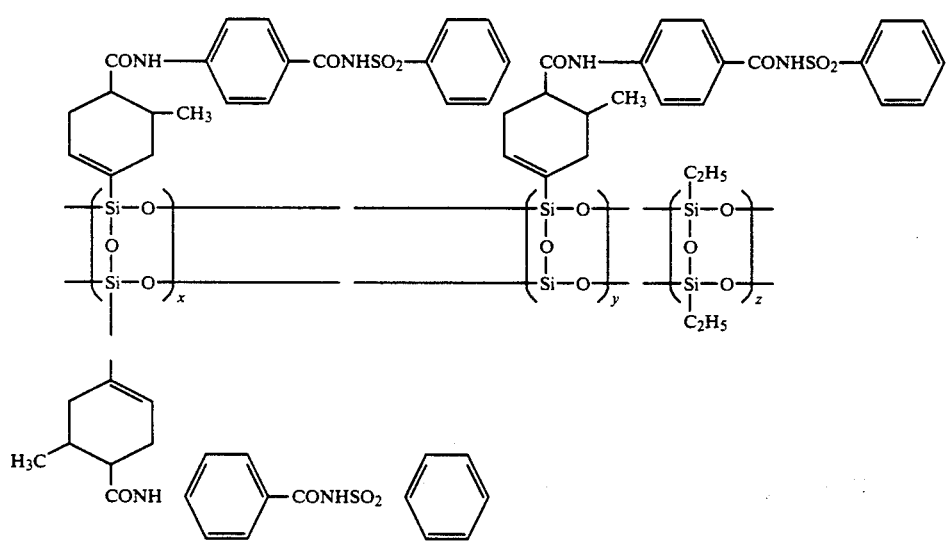
(49)
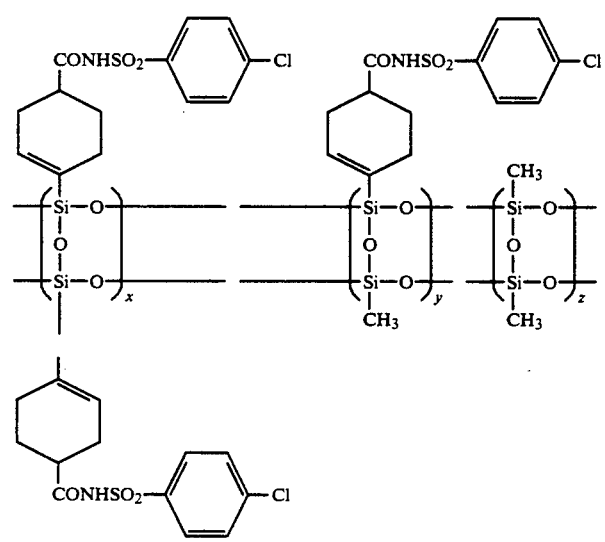

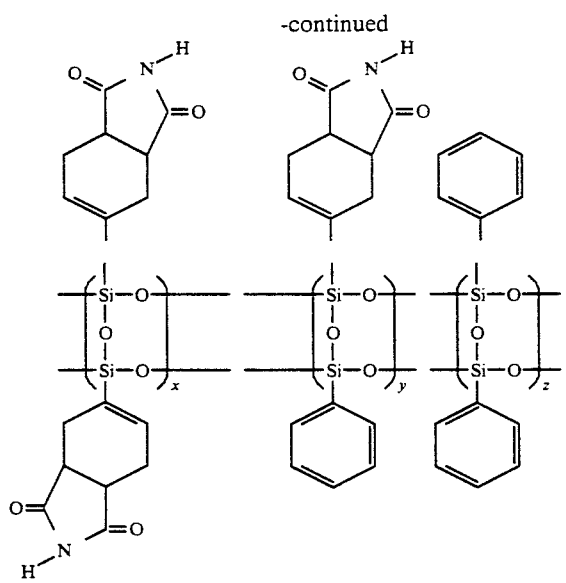
(50)
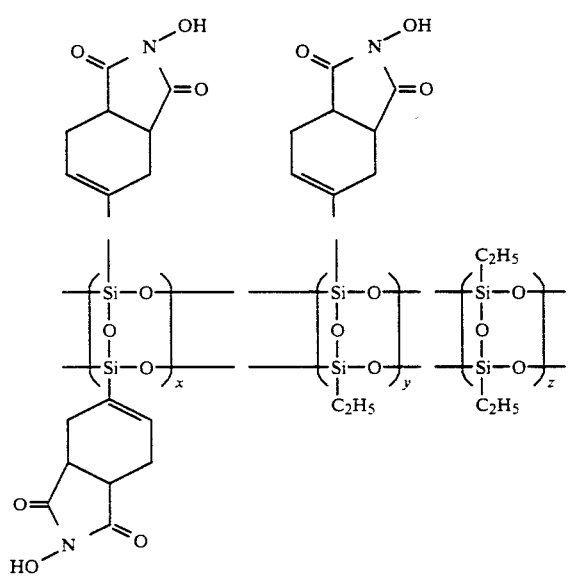
(51)
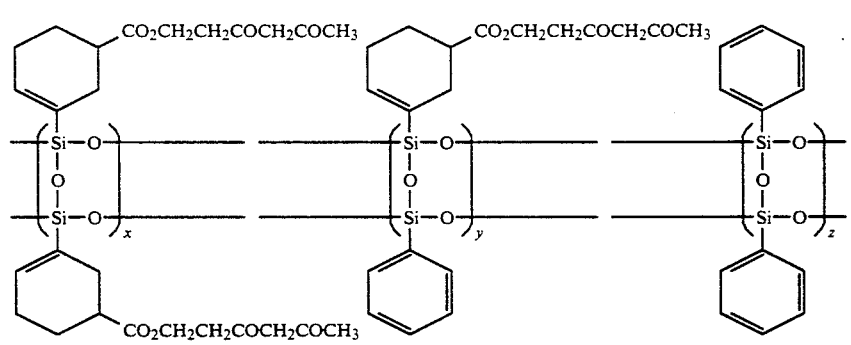
(52)
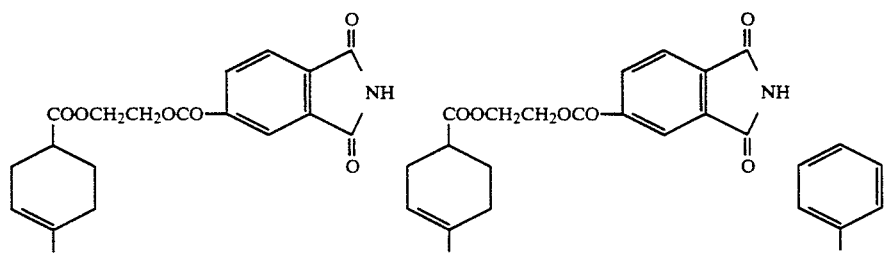
(53)

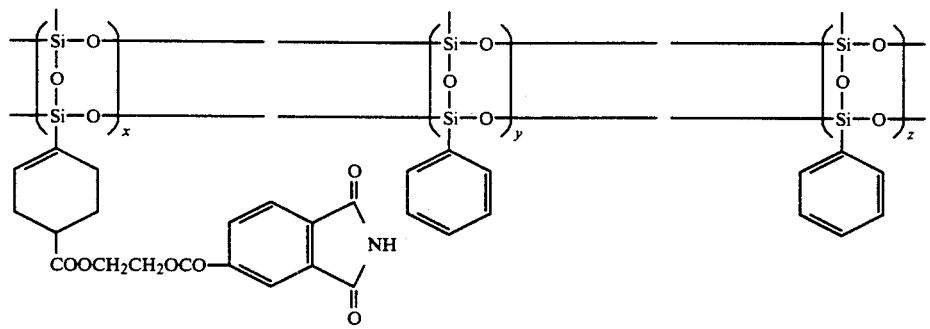
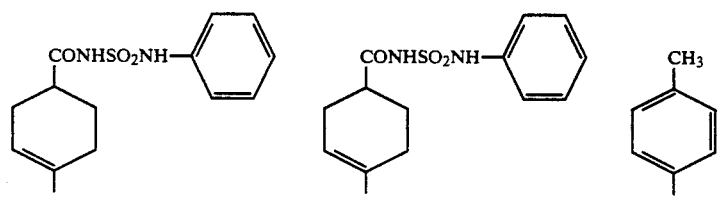
(54)
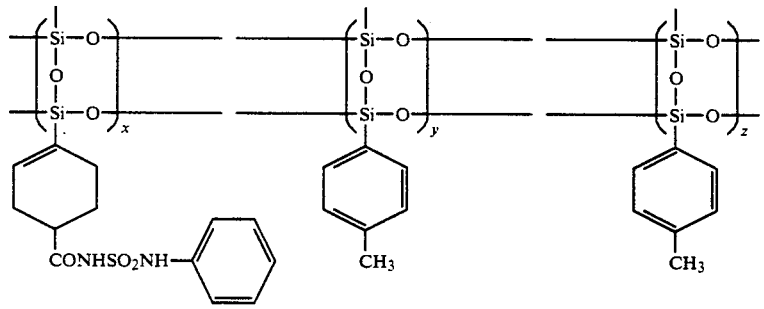
(55)
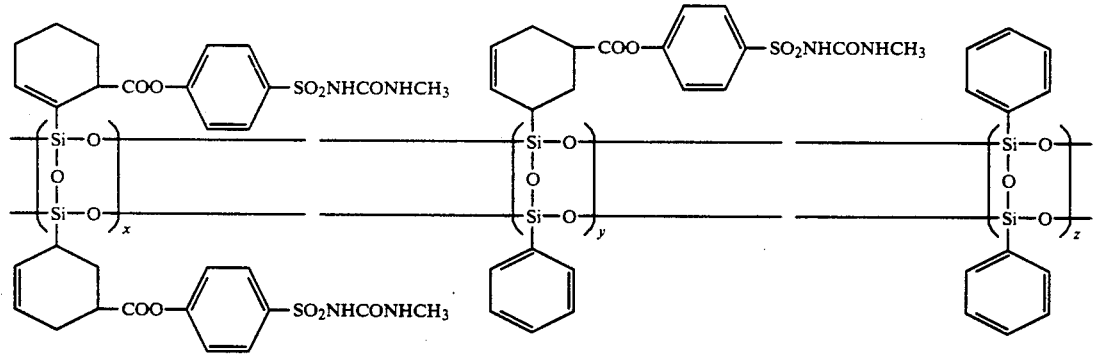
(56)
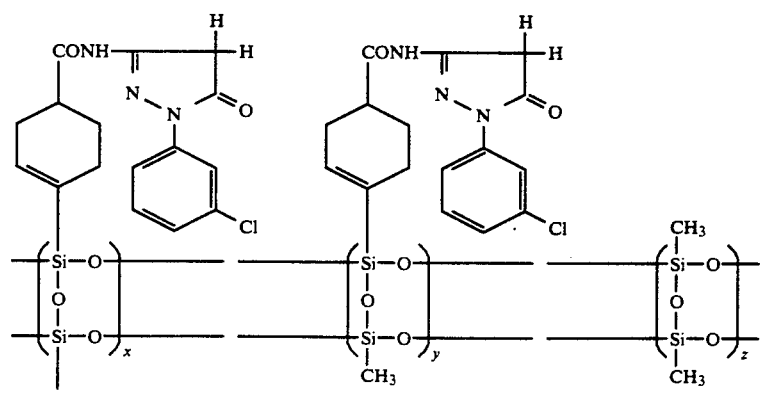

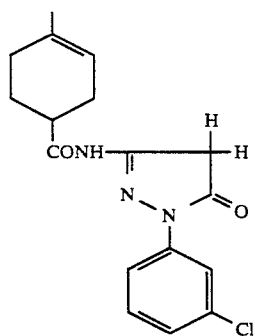
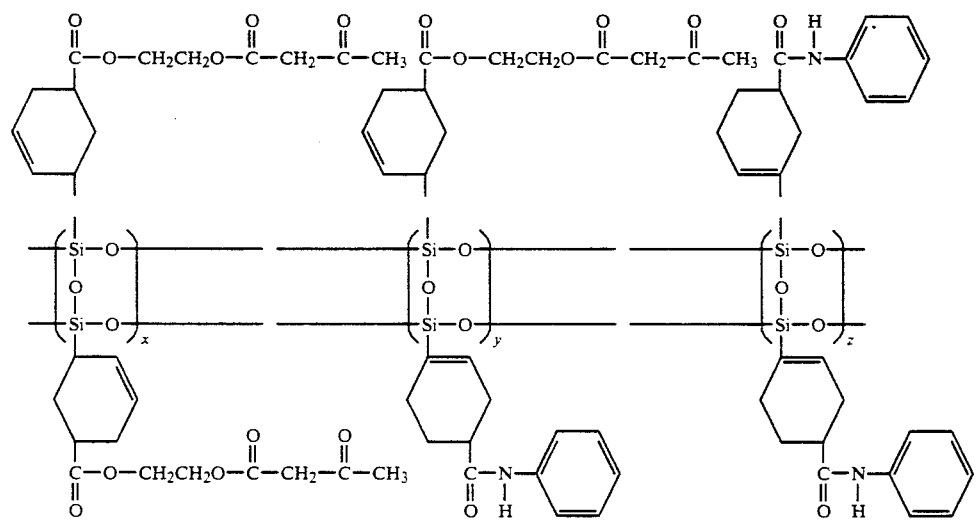
(57)
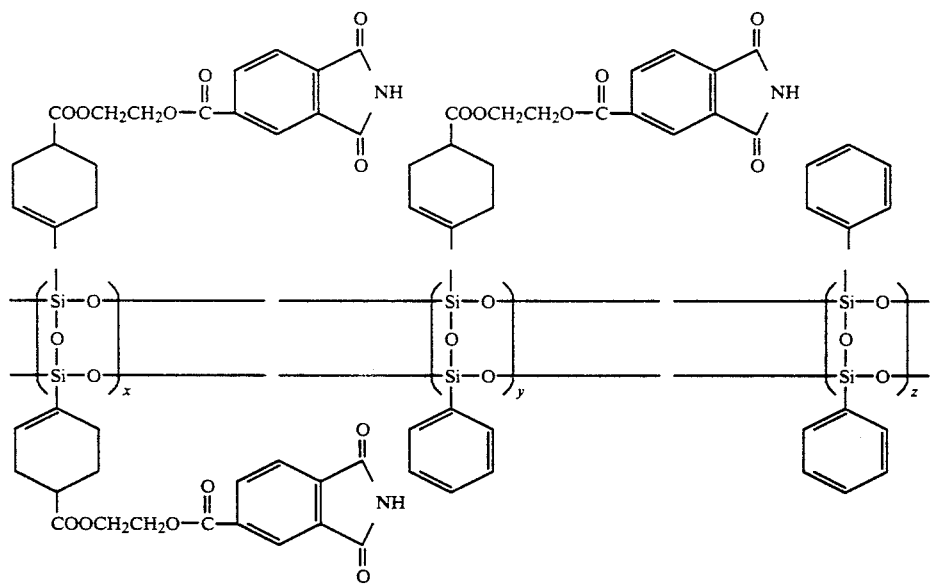
(58)
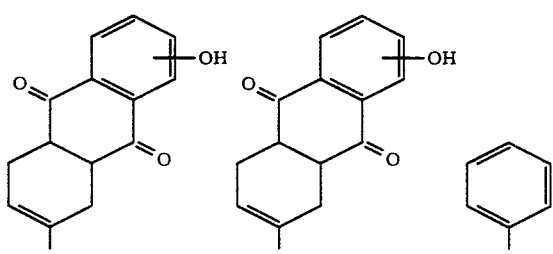
(59)

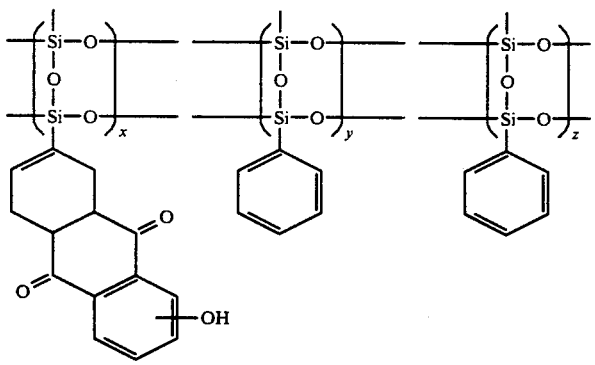

In the above formulas, n is an integer of not less than 1 and x, y and z are integers of 0 or not less than 1.

QUINONEDIAZIDE COMPOUNDS

The quinonediazide compound used in the present invention is generally expressed as a sulfonylester compound obtained by a chemical condensation between a 1,2-naphthoquinone diazide compound having a halogenosulfonyl group at 4- or 5-position such as a sulfonylchloride group and a mono- or poly-hydroxyphenyl compound. Typical examples of such a mono- or poly-hydroxyphenyl compound are benzophenone compounds such as 4-hydroxybenzophenone, 2,4-dihydroxybenzophenone, 2,2'-dihydroxybenzophenone, 4,4'-dihydroxybenzophenone, 2,3,4-trihydroxybenzophenone, 2,4,6-trihydroxybenzophenone, 2,4,4'-trihydroxybenzophenone, 2,3,4,4'-tetrahydroxybenzophenone, 2,2',4,4'-tetrahydroxybenzophenone, 2,3,4,2'-tetrahydroxybenzophenone, 3,3',4,4'-tetrahydroxybenzophenone, benzophenones having 5 or more hydroxy groups disclosed in J.P. KOKAI No. Sho 62-150245 and derivatives thereof. Further, there may be used p-cresol, p-t-butylphenol, resorcinol, pyrogallol, polyhydroxyphenylketones (such as 2,3,4-trihydroxyacetophenone, 2,3,4-trihydroxyphenyl pentyl ketone and 2,3,4-trihydroxyphenyl hexyl ketone), bis((poly)hydroxyphenyl)alkanes (such as bis(2,4-dihydroxyphenyl)methane, bis(2,3,4-trihydroxyphenyl)methane, bis(2,4-dihydroxyphenyl)propane-1, bis(2,3,4-trihydroxyphenyl)propane-1 and nordihydroguiaretic acid), polyhydroxybenzoates (such as propyl 3,4,5-trihydroxy-benzoate, phenyl 2,3,4-trihydroxybenzoate and phenyl 3,4,5-trihydroxybenzoate), bis(polyhydroxybenzoyl)alkanes or bis(polyhydroxybenzoyl)aryl compounds (such as bis(2,3,4-trihydroxybenzoyl)methane, bis(3-acetyl-4,5,6-trihydroxyphenyl)methane, bis(2,3,4-trihydroxybenzoyl)benzene and bis(2,4,6-trihydroxybenzoyl)benzene, alkylene-di(polyhydroxybenzoates) (such as ethyleneglycol-di(3,5-dihydroxybenzoate) and ethyleneglycol-di(3,4,5-trihydroxybenzoate), polyhydroxybiphenyls (such as 2,3,4-biphenyltriol, 3,4,5-biphenyltriol, 3,5,3',5'-biphenyltetrol, 2,4,2',4'-biphenyltetrol, 2,4,6,3',5'-pentol, 2,4,6,2',4',6'-biphenylhexol and 2,3,4,2',3',4'-biphenylhexol), bis(polyhydroxy)sulfides such as 4,4'-thiobis(1,3'-dihydroxy)benzene, bis(polyhydroxyphenyl)ether such as 2,2',4,4'-tetrahydroxydiphenylether, bis(polyhydroxyphenyl)sulfoxides such as 2,2',4,4'-tetrtahydroxydiphenylsulfoxide, bis(polyhydroxyphenyl)sulfones such as 2,2',4,4'-tetrtahydroxydiphenyl-sulfone, polyhydroxytriphenylmethanes (such as 4,4',3'',4'''-tetrahydroxy-3,5,3',5'-tetramethyl-triphenyl-methane, 4,4',2'',3'',4''-pentahydroxy-3,5,3',5'-tetramethyl-triphenylmethane, 2,3,4,2',3',4'-hexahydroxy-5,5'-diacetyl-triphenylmethane, 2,3,4,2',3',4',3'',4''-octahydroxy-5,5'-diacetyl-triphenylmethane and 2,4,6,2',4',6'-hexahydroxy-5,5'-dipropionyl-triphenylmethane), polyhydroxyspirobiindanes (such as 3,3,3',3'-tetramethyl-1,1'-spirobi-indane-5,6,5',6'-tetrol, 3,3,3',3'-tetramethyl-1,1'-spirobi-indane-5,6,7,5',6',7'-hexol, 3,3,3',3'-tetramethyl-1,1'-spirobi-indane-4,5,6,4',5',6'-hexol and 3,3,3',3'-tetramethyl-1,1'-spirobi-indane-4,5,6,5',6',7'-hexol), polyhydroxyphthalides (such as 3,3-bis(3,4-dihydroxyphenyl)phthalide, 3,3-bis(2,3,4-trihydroxyphenyl)phthalide and 3',4',5',6'-tetrahydroxyspiro(phthalide-3,9'-xanthene)) and flavono dyes such as morin, quercetin or rutin. Further, phenolformaldehyde resins or o-, m- or p-cresol-formaldehyde resins may also be used in the present invention.

Further, there may be used condensates of polyphenols and aldehydes-ketones disclosed in J.P. KOKAI Nos. Sho 56-1045 and 56-1044 and J.P. KOKOKU Nos. Sho 43-28403 and 49-24361; co-condensates of catechol, resorcinol or hydroquinone and substituted phenols and aldehydes-ketones disclosed in J.P. KOKAI Nos. Sho 59-84238 and 59-84239; condensates of substituted phenols and benzaldehyde disclosed in J.P. KOKAI No. Sho 60-31138; co-condensates of phenol, substituted phenol such as o-, m- or p-cresol and aldehydes-ketones; and p-hydroxystyrene polymers.

The 1,2-napthoquinone-2-diazide-4- and/or 5-sulfonic acid ester compound used in the present invention may be prepared by reacting one or more of the above mentioned mono- or poly-hydroxyphenyl compound with 1,2-naphthoquinone-2-diazide-4- and/or 5-sulfonyl halide in a reaction medium in the presence of a basic catalyst. The amount of 1,2-naphthoquinone-2-diazide-4-and/or 5-sulfonyl halide varies depending on the number of hydroxyl group of the polyhydroxyphenyl compound but usually ranges 0.1 to 1 mol per one equivalent of hydroxyl group.

The basic catalyst is, for instance, amines such as trimethylamine, triethylamine, tripropylamine, pyridine and tetramethylammonium hydroxide or inorganic alkalis such as sodium hydroxide, potassium hydroxide and sodium carbonate.

The amount of the catalyst used usually ranges from 0.8 to 2.0 mol, preferably 1.0 to 1.5 mol per one mol of 1,2-naphthoquinone-2-diazides.

In the reaction, there may be used as a reaction medium ketones such as acetone, methyl ethyl ketone and methyl isobutyl ketone; cyclic ethers such as dioxane and tetrahydrofuran; cyclic ketones such as cyclopentanone and cylcohexanone; amides such as N,N-dimethylformamide and N,N-dimethylacetamide; estes such as γ-butyrolactone, ethylene carbonate and propylene carbonate; pyrrolidone; methylpyrrolidone; and water. The amount of such a reaction medium usually ranges from 1 to 10 parts by weight per one part by weight of hydroxyphenyl compound.

The reaction may usually be carried out at a temperature of −30° to 60° C., preferably 0° to 40° C.

The amount of the 1,2-naphthoquinone-2-diazide compound contained in the light-sensitive composition of the invention is 5 to 70%, preferably 10 to 50% by weight based on the solid content of the composition.

ALKALI-SOLUBLE POLYMERS

The positive working light-sensitive composition of the present invention may further comprise an alkali-soluble polymer in addition to the polysiloxane compound and the orthoquinonediazide compound described above.

The alkali-soluble polymers used in the composition are polymers carrying acidic hydrogen atom having a pKa value of not more than 11 such as phenolic hydroxyl group, carboxyl group, sulfonic group, imide group, sulfonamide group, N-sulfonylamide group, N-sulfonylurethane group and/or active methylene group. Preferred alkali-soluble polymers are novolak type phenol resins such as phenol-formaldehyde resin, o-cresol-formaldehyde resin, m-cresol-formaldehyde resin, p-cresol-formaldehyde resin, xylenol-formaldehyde resin and co-condensates thereof. It is also possible to simultaneously use the aforesaid phenol resin and a condensate of phenol or cresol substituted with an alkyl group having 3 to 8 carbon atoms with formaldehyde such as t-butylphenol/formaldehyde resin as disclosed in J.P. KOKAI No. Sho 50-125806. Examples of other polymers usable in the invention are polymers comprising phenolic hydroxyl group-containing monomer such as N-(4-hydroxyphenyl) methacrylamide as a copolymerization component; homo- or copolymers of monomer(s) such as p-hydroxystyrene, o-hydroxystyrene, m-isopropenylphenol and/or p-isopropenylphenol and partially etherified or esterified products thereof.

Further, polymers comprising a carboxyl group-containing monomer such as acrylic acid and methacrylic acid as a copolymerization component; carboxyl group-containing polyvinyl acetal resins as disclosed in J.P. KOKAI No. Sho 61-267042; and carboxyl group-containing polyurethane resins as disclosed in J.P. KOKAI No. Sho 63-124047 can suitably be used.

Polymers comprising repeating units derived from monomers such as N-(4-sulfamoylphenyl) methyacrylamide, N-phenylsulfonyl methacrylamide and/or maleimide as copolymerization components; and active methylene group-containing polymers as disclosed in J.P. KOKAI No. Sho 63-127237 may also be used in the composition of the invention.

These alkali-soluble polymers may be used alone or in combination. The amount of these alkali-soluble polymers to be incorporated into the light-sensitive composition of the invention preferably ranges from 1 to 90% by weight, more preferably 5 to 80% by weight on the basis of the total weight of the solid content of the composition.

OTHER PREFERRED COMPONENTS

The light-sensitive composition of the present invention may further comprise cyclic acid anhydrides for increasing sensitivity of the composition, printing out agents for obtaining a visible image immediately after imagewise exposure, dyes for image coloring and other fillers. Examples of cyclic acid anhydrides are, as disclosed in U.S. Pat. No. 4,115,128, phthalic anhydride, tetrahydrophthalic anhydride, hexahydrophthalic anhydride, 3,6-endoxy-Δ$^4$-tetrahydrophthalic anhydride, tetrachlorophthalic anhydride, maleic anhydride, chloromaleic anhydride, α-phenylmaleic anhydride, succinic anhydride and pyromellitic acid. The sensitivity can be increased as high as about 3 times at maximum by incorporating these cyclic acid anhydride into the composition in the amount of 1 to 15% by weight based on the total weight of the composition. Examples of printing out agents for obtaining a visible image immediately after imagewise exposure include a combination of a light-sensitive compound releasing an acid upon exposure to light and a salt forming organic dye. Specific examples are a combination of o-naphthoquinonediazide-4-sulfonyl halide and a salt forming organic dye disclosed in J.P. KOKAI Nos. Sho 50-36209 and 53-8128 and a combination of a trihalomethyl compound and a salt forming organic dye disclosed in J.P. KOKAI Nos. Sho 53-36223, 54-74728, 60-3626, 61-143748, 61-151644 and 63-58440.

Other dyes than the salt forming organic dyes described above may be used as image coloring agents and preferred dyes include, for instance, oil-soluble dyes and basic dyes. Specific examples thereof are Oil Yellow #101, Oil Yellow #130, Oil Pink #312, Oil Green BG, Oil Blue BOS, Oil Blue #603, Oil Black BY, Oil Black BS, Oil Black T-505 (these dyes being available from ORIENT CHEMICAL INDUSTRIES, LTD.), Victoria Pure Blue, Crystal Violet (CI 42555), Methyl Violet (CI 42535), Rhodamine B (CI 45170 B), Malachite Green (CI 42000) and Methylene Blue (CI 52015). Further, the dyes disclosed in J.P. KOKAI No. Sho 62-293247 are particularly preferred.

SOLVENT

The positive working light-sensitive composition of the present invention is dissolved in a solvent capable of dissolving the components of the composition and then applied to the surface of a substrate if it is used as a material for PS plates. In addition, if it is used as a resist for processing semiconductors or the like, it is dissolved in a solvent and the solution is used as such. Examples of such solvents herein used are ethylene dichloride, cyclohexanone, methyl ethyl ketone, methyl isobutyl ketone, methanol, ethanol, propanol, ethylene glycol monomethyl ether, 1-methoxy-2-propanol, ethylene glycol monoethyl ether, 2-methoxyethyl acetate, 2-ethoxyethyl acetate, 1-methoxy-2-propyl acetate, dimethoxyethane, methyl lactate, ethyl lactate, N,N-dimethylacetamide, N,N-dimethylformamide, tetramethyl urea, N-methylpyrrolidone, dimethylsulfoxide, sulforane, γ-butyrolactone, toluene, ethyl acetate and ethyl cellosolve acetate. These solvents can be used alone or in combination.

The concentration of the foregoing components (the total solid content inclusive of additives) ranges from 2 to 50% by weight. When the solution is applied to a substrate, the amount thereof coated varies depending on the applications and, for instance, as a rule it preferably ranges from 0.5 to 3.0 g/m$^2$ based on the solid content for PS plates. As the amount thereof coated decreases, the light-sensitivity correspondingly increases, but, on the contrary, physical properties of the resultant film are impaired.

PREPARATION OF PS PLATES OR THE LIKE

When a PS plate is prepared from the positive working light-sensitive composition of this invention, a substrate is in general used and examples thereof include paper, paper laminated with a plastic film such as polyethylene, polypropylene or polystyrene film; a metal plate such as an aluminum (inclusive of aluminum alloys), zinc or copper plate; a plastic film such as a cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film; and paper or a plastic film listed above which is laminated with a metal foil or on which a layer of the foregoing metal is deposited. Particularly preferred is an aluminum plate because of its high dimensional stability and low cost. Further, it is also preferred to use a composite sheet comprising a polyethylene terephthalate film on which an aluminum sheet is bonded as disclosed in J.P. KOKOKU No. Sho 48-18327.

The surface of the aluminum plate is preferably grained by, for instance, mechanical methods such as wire brush graining, brush graining which comprises graining with a nylon brush while pouring a slurry of abrasive particles, ball graining, graining through liquid honing and buff graining; chemical graining methods such as those in which HF, $AlCl_3$ or HCl is used as an etchant; electrolytic graining in which nitric acid or hydrochloric acid is used as an electrolyte; or combined graining comprising combinations thereof, then optionally etched with an acid or alkali and anodized in an electrolyte such as sulfuric acid, phosphoric acid, oxalic acid, boric acid, chromic acid, sulfamic acid or a mixture thereof using a DC or AC current to form a strong passivation film on the surface of the aluminum plate. Such a passivation film per se makes the aluminum plate surface hydrophilic, but it is particularly preferred that the aluminum plate is optionally hydrophilized by subjecting it to a silicate (sodium silicate, potassium silicate) treatment as disclosed in U.S. Pat. Nos. 2,714,066 and 3,181,461; a potassium fluorozirconate treatment as disclosed in U.S. Pat. No. 2,946,638; a phosphomolybdate treatment as disclosed in U.S. Pat. No. 3,201,247; an alkyl titanate treatment as disclosed in U.K. Patent No. 1,108,559; a polyacrylic acid treatment as disclosed in German Patent No. 1,091,433; a polyvinyl phosphonic acid treatment as disclosed in German Patent No. 1,134,093 and U.K. Patent No. 1,230,447; a phosphonic acid treatment as disclosed in J.P. KOKOKU No. Sho 44-6409; a phytic acid treatment as disclosed in U.S. Pat. No. 3,307,951; a combined treatment with a hydrophilic organic polymeric compound and a bivalent metal as disclosed in J.P. KOKAI Nos. Sho 58-16893 and Sho 58-18291; a treatment by means of an underlying coating of an water-soluble polymer having sulfonic groups as disclosed in J.P. KOKAI No. Sho 59-101651. Examples of other hydrophilization treatments are silicate electrodeposition treatments as disclosed in U.S. Pat. No. 3,658,662.

It is also preferred to use an aluminum plate which is subjected to a sealing treatment after graining and anodization treatments. Such a sealing treatment can be performed by immersing the aluminum plate in hot water or a hot aqueous solution containing an inorganic or organic salt or by means of a steam bath.

ACTINIC RAYS OR RADIANT RAYS

Light sources for actinic rays or radiant rays used in the present invention are, for instance, a mercury lamp, a metal halide lamp, a xenon lamp, a chemical lamp and a carbon arc lamp for actinic rays and electron rays, X-rays, ion beam and far ultraviolet rays for radiant rays. Preferred examples of light sources are g-rays, i-rays and Deep-UV rays for photoresists. In addition, a scanning exposure techique with a high energy density beam such as laser beam or electron rays can be employed in the invention. Examples of such laser beam sources are a He.Ne laser, an Ar laser, a Kr ion laser, a He.Cd laser and KrF excimer laser.

Developer

Examples of developers for the positive working light-sensitive composition of the present invention preferably include an aqueous solution of an inorganic alkali agent such as sodium silicate, potassium silicate, sodium hydroxide, potassium hydroxide, lithium hydroxide, tertiary sodium phosphate, secondary sodium phosphate, tertiary ammonium phosphate, secondary ammonium phosphate, sodium metasilicate, sodium bicarbonate and ammonia and an organic alkali agent such as tetraalkyl ammonium hydroxide. These alkaline agents may be used alone or in combination. The concentration thereof ranges from 0.1 to 10% by weight and preferably 0.5 to 5% by weight.

These aqueous alkali solutions may optionally comprise a surfactant or an organic solvent such as an alcohol.

The positive working light-sensitive composition of the present invention is excellent in adhesion to a substrate, coating property and resistance to oxygen plasma and can be developed by alkali and simply and easily be prepared.

The present invention will hereunder be explained in more detail with reference to the following non-limitative working Examples and the effects practically achieved by the present invention will also be discussed in detail.

PREPARATION EXAMPLE 1

Polysiloxane (50) of the Present Invention

Maleimide (7.3 g) and 2-trimethoxysilyl-1,3-butadiene (13.1 g) were dissolved in 500 ml of dioxane. The mixture was kept at 100° C. for one hour. To the reaction mixture, phenyltriethoxysilane (102 g) was added and then 10 ml of distilled water and 0.2 ml of hydrochloric acid were added. The mixture was heated and concentrated for 30 minutes. The concentrate was poured into 2000 ml of distilled water while stirring. The precipitated solid was dried in vacuo to obtain 51 g of the target polysiloxane.

The weight average molecular weight of the polysiloxane was found 1200 by Gel Permeation Chromatography.

PREPARATION EXAMPLE 2

Polysiloxane (39) of the Present Invention

Acetylene dicarboxylic acid (11.4 g), 2-trimethoxysilyl-1,3-butadiene (17.4 g) and tolyltrimethoxysilane (122.6 g) were reacted in dioxane in the same manner as in Preparation Example 1 to obtain 43 g of the target polysiloxane.

The weight average molecular weight of the polysiloxane was found 8600 by Gel Permeation Chromatography.

PREPARATION EXAMPLE 3

Polysiloxane (25) of the Present Invention

N-(p-hydroxyphenyl)maleimide (18.9 g) and 2-trimethoxysilyl-1,3-butadiene (17.4 g) were reacted in 500 ml of ethyleneglycol monomethylether in the same manner as in Preparation Example 1 to obtain 18 g of the target polysiloxane.

The weight average molecular weight of the polysiloxane was found 3300 by Gel Permeation Chromatography.

PREPARATION EXAMPLE 4

Polysiloxane (27) of the Present Invention

N-(p-sulfamoyl)maleimide (25.2 g) and 2-trimethoxysilyl-1,3-butadiene (17.4 g) were reacted in 500 ml of N,N-dimethylacetamide in the same manner as in Preparation Example 1 to obtain 36 g of the target polysiloxane.

The weight average molecular weight of the polysiloxane was found 2300 by Gel Permeation Chromatography.

PREPARATION EXAMPLE 5

Polysiloxane (44) of the Present Invention

N-(p-toluenesulfonyl)acrylamide (22.5 g), 2-trimethoxysilyl-1,3-butadiene (17.4 g) and 4-chlorophenyltrimethoxysilane (64 g) were reacted in 500 ml of ethyleneglycol monomethylether in the same manner as in Preparation Example 1 to obtain 40 g of the target polysiloxane.

The weight average molecular weight of the polysiloxane was found 4700 by Gel Permeation Chromatography.

PREPARATION EXAMPLE 6

Polysiloxane (57) of the Present Invention

Acetoacetoxyethylacrylate (10.0 g), 2-trimethoxysilyl-1,3-butadiene (17.4 g) and N-phenylacrylamide (8.4 g) were reacted in dioxane in the same manner as in Preparation Example 1 to obtain 25.1 g of the target polysiloxane.

The weight average molecular weight of the polysiloxane was found 1700 by Gel Permeation Chromatography.

EXAMPLES 1 TO 6

A 2 S aluminum plate having a thickness of 0.24 mm was immersed in 10% aqueous solution of tertiary sodium phosphate maintained at 80° C. for 3 minutes to degrease the same, grained with a nylon brush, etched with a sodium aluminate solution for about 10 minutes and then desmutted with a 3% aqueous solution of sodium hydrogen sulfate. The aluminum plate was then anodized at a current density of 2 A/dm$^2$ for 2 minutes in a 20% sulfuric acid solution to thus obtain an aluminum substrate.

Six kinds of solutions, (A)-1 to (A)-6, of light-sensitive composition (hereunder referred to as "light-sensitive solutions") were prepared by changing the kinds of polysiloxane compounds of the present invention used in light-sensitive solution (A) having the following composition. Each of these light-sensitive solutions was applied to the anodized aluminum plate and dried at 100° C. for 2 minutes to obtain PS plates (A)-1 to (A)-6, respectively. The coated amount of the light-sensitive solution was 1.5 g/m$^2$ (weighed after drying) in all the PS plates.

The polysiloxane compounds used in the light-sensitive solutions (A)-1 to (A)-6 are listed in Table I given below.

| Light-sensitive Solution (A) | |
|---|---|
| Component | Amount (g) |
| 1,2-naphthoquinone-2-diazide-5-sulfonate of 2,3,4,4'-tetrahydroxybenzophenone | 0.40 |
| Polysiloxane compound of the invention | 1.0 |
| Cresol (m/p = 6/4)-formaldehyde resin | 0.3 |
| Oil Blue #603 (available from ORIENT CHEMICAL INDUSTRIES CO., LTD.) | 0.02 |
| Dichloroethane | 10 |
| Methyl cellosolve | 10 |

A gray scale having a density difference of 0.15 was brought in close contact with the light-sensitive layer of each PS plate (A)-1 to (A)-6 and the layer was exposed to light from a 2 KW high pressure mercury lamp at a distance of 50 cm for 2 minutes. The exposed PS plates (A)-1 to (A)-6 were immersed in and developed with DP-4 (a tradename of the developer available from Fuji Photo Film Co., Ltd.) diluted 8 times with water for 60 seconds at 25° C. to thus obtain positive images dyed clear blue.

TABLE I

| Example No. | PS plate | Polysiloxane of the invention |
|---|---|---|
| 1 | (A)-1 | Compound (50) |
| 2 | (A)-2 | Compound (39) |
| 3 | (A)-3 | Compound (25) |
| 4 | (A)-4 | Compound (27) |
| 5 | (A)-5 | Compound (44) |
| 6 | (A)-6 | Compound (57) |

EXAMPLES 7 TO 12

Each of light-sensitive solutions (A')-1 to (A')-6 which had the same compositions as those of the light-sensitive solutions (A)-1 to (A)-6 used in Examples 1 to 6 except that Oil Blue #603 was removed was applied to a silicon wafer with a spinner and dried on a hot plate maintained at 90° C. for 2 minutes. The thickness of the layer was 1.0 μm.

Then the resultant light-sensitive layer was exposed to light with a scale down projection aligner (stepper) using monochromatic light of 436 nm and was developed with a 2.4% aqueous solution of tetramethyl ammonium hydroxide for 60 seconds to form a resist pattern. As a result, a good pattern having a line & space of 0.8 μm was obtained.

EXAMPLE 13

A commercially available novolak type resist HPR-204 (available from Fuji Hunt Chemical Co., Ltd.) was applied to a silicon wafer with a spinner and dried at 220° C. for one hour to form an underlying coating. The thickness thereof was 2.0 μm.

The following light-sensitive solution (B) was applied to the underlying layer with a spinner and dried on a hot plate maintained at 90° C. for 2 minutes to form a coated film having a thickness of 0.5 μm.

| Light-sensitive Solution (B) | |
|---|---|
| Component | Amount (g) |
| Cresol (m/p = 6/4)-formaldehyde novolak resin | 0.10 |
| 1,2-naphthoquinone-2-diazide-5-sulfonate of 2,3,4,4'-tetrahydroxybenzophenone | 0.30 |
| Polysiloxane compound (50) of the invention | 0.50 |
| Ethyl cellosolve acetate | 8.5 |

The resulting light-sensitive layer was exposed to light and developed in the same manner as used in Examples 7 to 12 and as a result, a good pattern having a line & space of 0.8 μm was obtained. Then the layer was subjected to an oxygen plasma etching under the conditions of 20 mTorr of $O_2$ gas pressure and 0.06 W/cm² of RF power. Thus, the lower resist which was not covered by the resist pattern was completely eliminated. More specifically, it was confirmed that the resist of the invention could be used as an upper resist in the two layer resist technique.

What is claimed is:

1. A light-sensitive composition comprising:
(a) a polysiloxane compound having at least 1 mol % of a structural unit derived from a product of a thermal cycloaddition reaction between a compound of formula (I), (II), (III) or (IV) and a compound of formula (V), (VI), (VII) or (VIII), and
(b) an ester of 1,2-naphthoquinone-2-diazide-4-or 5-sulfonic acid and a mono- or poly-hydroxyphenyl compound;

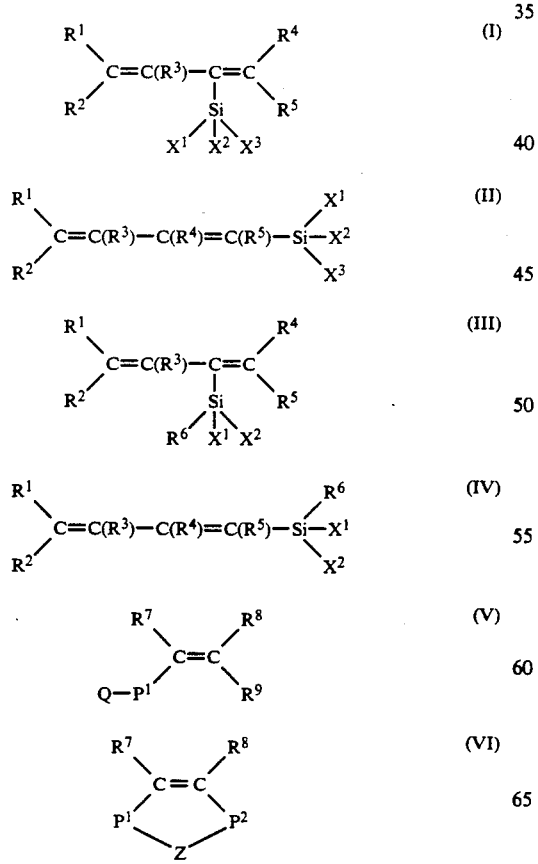

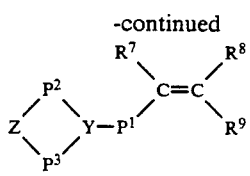

wherein $R^1$ to $R^5$ may be same or different and represent hydrogen, alkyl, substituted alkyl, aryl, substituted aryl, silyl, substituted silyl, siloxy or substituted siloxy groups, $R^6$ represents hydrogen, an alkyl, substituted alkyl, aryl, substituted aryl,

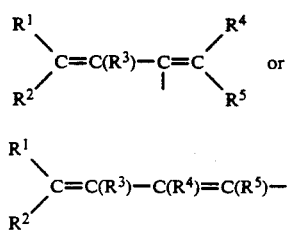

$R^7$ to $R^9$ represent hydrogen, alkyl, substituted alkyl, aryl, substituted aryl, alkoxy, substituted alkoxy, cyano, nitro groups, $—P^1—Q$ or

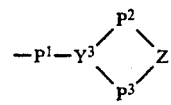

which may contain —O—, —CO—, —COO—, —OCO—, —CONR¹⁰—, —NR¹⁰CO—, —SO₂— or —SO₃—, $R^{10}$ represents hydrogen, an alkyl, substituted alkyl, aryl or substituted aryl group, $R^7$ and $R^8$ or $R^7$ and $P^1$ may combine to form a ring, $X^1$ to $X^3$ represent hydroxy groups or hydrolyzable groups, $P^1$ to $P^3$ represent single bonds, alkylene, substituted alkylene, arylene or substituted arylene groups which may contain —O—, —CO—, —COO—, —OCO—, —CONR¹⁰—, —NR¹⁰CO—, —SO₂— or —SO₃—, $Y^3$ represents a trivalent aromatic ring, Q represents an acid group having pKa of not more than 12, Z represents

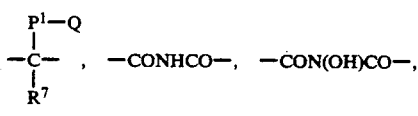

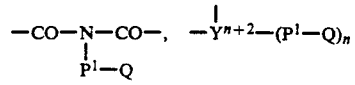

wherein
$Y^{n+2}$ represents a (n+2) valent aromatic ring, and n is an integer of 1 to 3.

2. The light-sensitive composition of claim 1, wherein the amount of the polysiloxane compound ranges from 5 to 95% by weight of the total solid weight of the composition and the amount of the quinonediazide compound ranges from 5 to 70% by weight of the total solid content of the composition.

3. The light-sensitive composition of claim 1, wherein it further comprises an alkali-soluble polymer in the amount of 1 to 90% by weight of the total solid content of the composition.

4. The light-sensitive composition of claim 1, wherein the polysiloxane compound contains at least 3 mol % of the structural unit.

5. The light-sensitive composition of claim 1, wherein the polysiloxane compound contains at least 5 mol % of the structural unit.

6. The light-sensitive composition of claim 1, wherein the polysiloxane is a co-condensate of at least one compound of formula (IX) to (XXIV) and at least one compound of formula (XXV) to (XXIX), which co-condensate contains at least 1 mol % of the siloxane unit derived from the thermal cycloaddition reaction product between a compound of formula (I), (II), (III) or (IV) and a compound of formula (V), (VI), (VII) or (VIII);

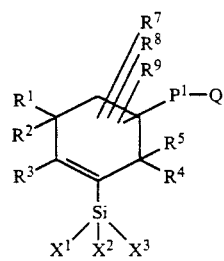

(IX)

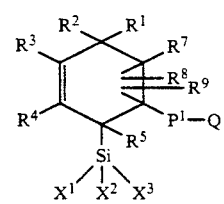

(X)

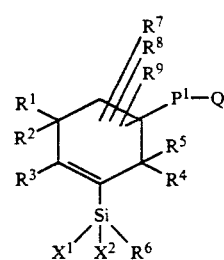

(XI)

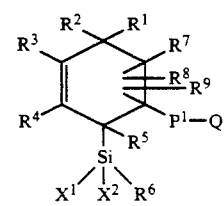

(XII)

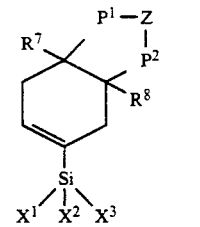

(XIII)

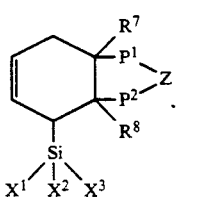

(XIV)

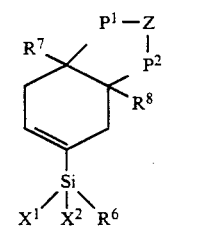

(XV)

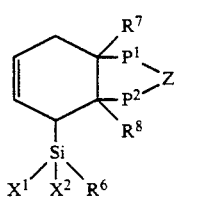

(XVI)

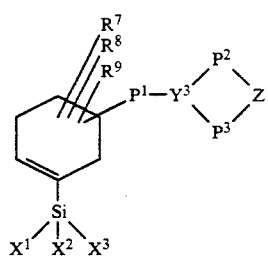

(XVII)

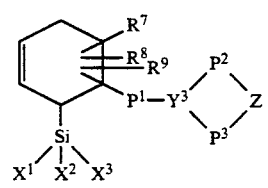

(XVIII)

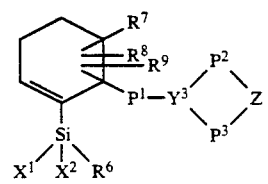

(XIX)

(XX)

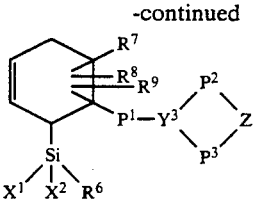

(XXI)

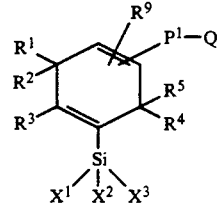

(XXII)

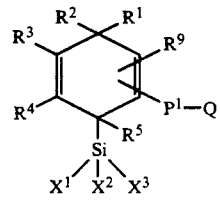

(XXIII)

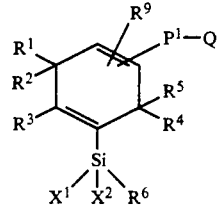

(XXIV)

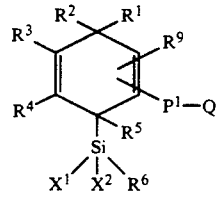

(XXV)

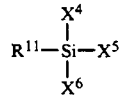

(XXVI)

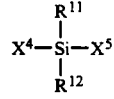

(XXVII)

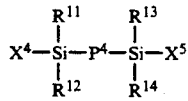

(XXVIII)

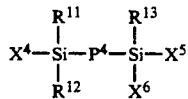

(XXIX)

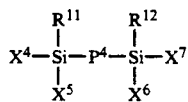

wherein $R^1$ to $R^5$ may be same or different and represent hydrogen, alkyl, substituted alkyl, aryl, substituted aryl, silyl, substituted silyl, siloxy or substituted siloxy groups, $R^6$ represents hydrogen, an alkyl, substituted alkyl, aryl, substituted aryl,

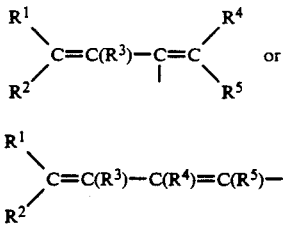 or $R^7$ to $R^9$ represent hydrogen, an alkyl, substituted alkyl, aryl, substituted aryl, alkoxy, substituted alkoxy, cyano, nitro groups, —$P^1$—Q or

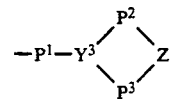

which may contain —O—, —CO—, —COO—, —OCO—, —CONR$^{10}$—, —NR$^{10}$CO—, —SO$_2$— or —SO$_3$—, $R^{10}$ to $R^{14}$ represent hydrogen, alkyl, substituted alkyl, aryl or substituted aryl groups, $R^7$ and $R^8$ or $R^7$ and $P^1$ may combine to form a ring, $X^1$ to $X^7$ represent hydroxy groups or hydrolyzable groups, $P^1$ to $P^4$ represent single bonds, alkylene, substituted alkylene, arylene or substituted arylene groups which may contain —O—, —CO—, —COO—, —OCO—, —CONR$^{10}$—, —NR$^{10}$CO—, —SO$_2$— or —SO$_3$—, $Y^3$ represents a trivalent aromatic ring, Q represents an acid group having pKa of not more than 12, Z represents

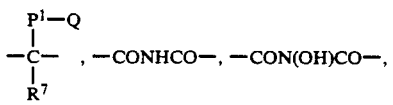

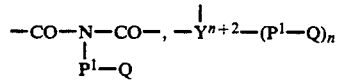

wherein $Y^{n+2}$ represents a (n+2) valent aromatic ring, and n is an integer of 1 to 3.

7. The light-sensitive composition of claim 1, wherein the polysiloxane is a product of the thermal cycloaddition reaction between a compound of formula (I), (II), (III) or (IV) and a compound of formula (V), (VI), (VII) or (VIII) in the presence of at least one compound of formula (XXX) or (XXXI);

(XXX)

-continued

wherein $D^1$ and $D^2$ may be same or different and may combine to form a ring but do not contain acid groups having pKa of not more than 12, and the polysiloxane contains at least 1 mol % of the siloxane unit derived from the thermal cycloaddition reaction product between the compound of formula (I), (II), (III) or (IV) and the compound of formula (V), (VI), (VII) or (VIII).

8. A light-sensitive composition which comprises:
(a) a polysiloxane compound having at least 1 mol % of a structural unit derived from a product of a thermal cycloaddition reaction between a compound of formula (I), (II), (III) or (IV) and a compound of formula (V), (VI), (VII) or (VIII),
(b) an ester of 1,2-naphthoquinone-2-diazide-4-or 5-sulfonic acid and a mono- or poly-hydroxyphenyl compound, and
(c) a solvent;

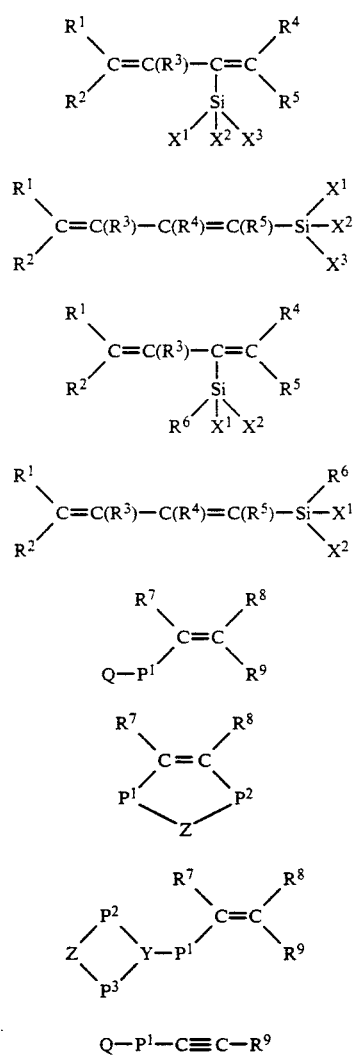

wherein $R^1$ to $R^5$ may be same or different and represent hydrogen, alkyl, substituted alkyl, aryl, substituted aryl, silyl, substituted silyl, siloxy or substituted siloxy groups, $R^6$ represents hydrogen, an alkyl, substituted alkyl, aryl, substituted aryl,

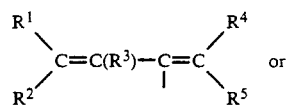

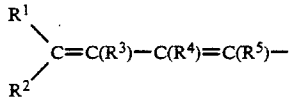

$R^7$ to $R^9$ represent hydrogen, alkyl, substituted alkyl, aryl, substituted aryl, alkoxy, substituted alkoxy, cyano, nitro groups, —$P^1$—Q or

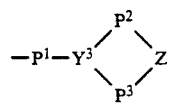

may contain —O—, —CO—, —COO—, —OCO—, —CONR$^{10}$—, —NR$^{10}$CO—, —SO$_2$— or —SO$_3$—, $R^{10}$ represents hydrogen, an alkyl, substituted alkyl, aryl or substituted aryl group, $R^7$ and $R^8$ or $R^7$ and $P^1$ may combine to form a ring, $X^1$ to $X^3$ represent hydroxy groups or hydrolyzable groups, $P^1$ to $P^3$ represent single bonds, alkylene, substituted alkylene, arylene or substituted arylene groups which may contain —O—, —CO—, —COO—, —OCO—, —CONR$^{10}$—, —NR$^{10}$CO—, —SO$_2$— or —SO$_3$—, $Y^3$ represents a trivalent aromatic ring, Q represents an acid group having pKa of not more than 12, Z represents

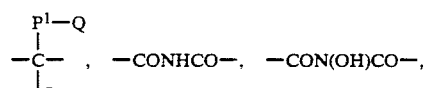

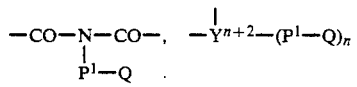

wherein $Y^{n+2}$ represents a (n+2) valent aromatic ring, and n is an integer of 1 to 3.

9. The light-sensitive composition of claim 8, wherein it further comprises an alkali-soluble polymer.

10. The light-sensitive composition of claim 9, wherein the alkali-soluble polymer is a polymer carrying acidic hydrogen atom having a pKa value of not more than 11.

11. The light-sensitive composition of claim 9, wherein the alkali-soluble polymer is a novolak type phenol resin.

12. The light-sensitive composition of claim 9, wherein the amount of the alkali-soluble polymer ranges from 5 to 80% by weight based on the solid content of the light-sensitive composition.

13. The light-sensitive composition of claim 9, wherein the solvent is selected from the group consisting of ethylene dichloride, cyclohexanone, methyl ethyl ketone, methyl isobutyl ketone, methanol, ethanol, propanol, ethylene glycol monomethyl ether, 1-methoxy-2-propanol, ethylene glycol monoethyl ether, 2-methoxyethyl acetate, 2-ethoxyethyl acetate, 1-methoxy-2-propyl acetate, dimethoxyethane, methyl lactate, ethyl lactate, N,N-dimethylacetamide, N,N-dimethylformamide, tetramethyl urea, N-methylpyrrolidone, dimethylsulfoxide, sulforane, γ-butyrolactone, toluene, ethyl acetate, ethyl cellosolve acetate and mixtures thereof.

* * * * *

UNITED STATES PATENT AND TRADEMARK OFFICE
CERTIFICATE OF CORRECTION

PATENT NO. : 5,143,816
DATED : September 1, 1992
INVENTOR(S) : Kazuyoshi MIZUTANI et al It is certified that error appears in the above-identified patent and that said Letters Patent is hereby corrected as shown below:

On title page, item [54] and col. 1, lines 1-2 should read

--LIGHT-SENSITIVE COMPOSITION COMPRISING A POLYSILOXANE AND A NAPHTHOQUINONE DIAZIDE--.

Signed and Sealed this

Twenty-fourth Day of August, 1993

Attest:

BRUCE LEHMAN

*Attesting Officer*    Commissioner of Patents and Trademarks